United States Patent
Cong et al.

(10) Patent No.: US 12,456,614 B2
(45) Date of Patent: Oct. 28, 2025

(54) PROCESS KITS AND RELATED METHODS FOR PROCESSING CHAMBERS TO FACILITATE DEPOSITION PROCESS ADJUSTABILITY

(71) Applicant: Applied Materials, Inc., Santa Clara, CA (US)

(72) Inventors: Zhepeng Cong, San Jose, CA (US); Ala Moradian, Sunnyvale, CA (US); Tao Sheng, Santa Clara, CA (US); Nimrod Smith, Cupertino, CA (US); Ashur J. Atanos, San Jose, CA (US); Vinh N. Tran, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 445 days.

(21) Appl. No.: 17/871,455

(22) Filed: Jul. 22, 2022

(65) Prior Publication Data

US 2023/0386802 A1   Nov. 30, 2023

Related U.S. Application Data

(60) Provisional application No. 63/346,681, filed on May 27, 2022.

(51) Int. Cl.
*H01J 37/32* (2006.01)
*C23C 14/56* (2006.01)
(Continued)

(52) U.S. Cl.
CPC ...... *H01J 37/32834* (2013.01); *C23C 14/564* (2013.01); *C23C 16/4585* (2013.01);
(Continued)

(58) Field of Classification Search
CPC .......... H01J 37/32834; H01J 37/32477; C23C 14/564; C23C 16/4586; C23C 16/45501;
(Continued)

(56) References Cited

U.S. PATENT DOCUMENTS 5,685,906 A * 11/1997 Dietze ................ C30B 25/10
118/725
5,935,337 A    8/1999 Takeuchi et al.
(Continued)

FOREIGN PATENT DOCUMENTS

CN    113990780 A    1/2022
CN    111893567 B    2/2022
(Continued)

OTHER PUBLICATIONS

Non-Final Office Action dated Aug. 15, 2024 for U.S. Appl. No. 17/871,607.
(Continued)

*Primary Examiner* — Rodney G McDonald
(74) *Attorney, Agent, or Firm* — Patterson + Sheridan, LLP

(57) ABSTRACT

The present disclosure relates to flow guides, process kits, and related methods for processing chambers to facilitate deposition process adjustability. In one implementation, a flow guide includes a middle plate having a first side and a second side opposing the first side along a first direction. The first side and the second side are arcuate. The flow guide includes a first flange extending outwardly relative to a third side of the middle plate and outwardly relative to an outer face of the middle plate, and a second flange extending outwardly relative to a fourth side of the middle plate and outwardly relative to the outer face of the middle plate. The fourth side opposes the third side along a second direction that intersects the first direction. The flow guide includes a
(Continued)

rectangular flow opening defined between the first flange and the second flange.

20 Claims, 36 Drawing Sheets

(51) Int. Cl.
*C23C 16/458* (2006.01)
*C30B 25/10* (2006.01)
*C30B 25/12* (2006.01)
*C30B 25/14* (2006.01)
*H01L 21/02* (2006.01)
*H01L 21/67* (2006.01)
*H01L 21/687* (2006.01)

(52) U.S. Cl.
CPC .............. *C30B 25/10* (2013.01); *C30B 25/12* (2013.01); *C30B 25/14* (2013.01); *H01J 37/32477* (2013.01); *H01L 21/02057* (2013.01); *H01L 21/67051* (2013.01); *H01L 21/68735* (2013.01)

(58) Field of Classification Search
CPC ............ C23C 16/4585; C23C 16/4412; C23C 16/45502; C23C 16/45563; H01L 21/02057; H01L 21/67051; H01L 21/68735; H01L 21/67115; C30B 25/10; C30B 25/12; C30B 25/14; C30B 25/105
USPC ......................................................... 118/725
See application file for complete search history.

(56) References Cited

U.S. PATENT DOCUMENTS

| | | | |
|---|---|---|---|
| RE36,957 E | 11/2000 | Brors et al. | |
| 6,383,330 B1 * | 5/2002 | Raaijmakers | ....... C23C 16/4585 118/725 |
| 8,216,375 B2 | 7/2012 | Liu | |
| 8,512,472 B2 | 8/2013 | Vatus et al. | |
| 10,544,519 B2 | 1/2020 | Savas et al. | |
| 10,861,722 B2 | 12/2020 | Colombeau et al. | |
| 2005/0199184 A1 | 9/2005 | Murugesh et al. | |
| 2010/0120259 A1 * | 5/2010 | Vatus | ................. C23C 16/4585 438/758 |
| 2013/0045331 A1 | 2/2013 | Kim et al. | |
| 2013/0284097 A1 | 10/2013 | Ranish et al. | |
| 2014/0026816 A1 | 1/2014 | Myo et al. | |
| 2016/0068959 A1 | 3/2016 | Lau et al. | |
| 2018/0315626 A1 | 11/2018 | Franklin | |
| 2019/0393032 A1 | 12/2019 | Yamamoto et al. | |
| 2022/0056583 A1 | 2/2022 | Tu et al. | |
| 2022/0121196 A1 | 4/2022 | Omori | |
| 2022/0162751 A1 | 5/2022 | Haanstra et al. | |
| 2022/0170156 A1 | 6/2022 | Jdira et al. | |
| 2022/0181193 A1 | 6/2022 | Gao et al. | |
| 2022/0189804 A1 | 6/2022 | Luan et al. | |
| 2022/0199444 A1 | 6/2022 | Oosterlaken et al. | |
| 2022/0254668 A1 | 8/2022 | Oosterlaken et al. | |
| 2022/0268520 A1 | 8/2022 | Oosterlaken et al. | |
| 2022/0298643 A1 | 9/2022 | Kajbafvala et al. | |
| 2022/0298672 A1 | 9/2022 | M'Saad et al. | |
| 2022/0301829 A1 | 9/2022 | Yoshikawa | |
| 2022/0301905 A1 | 9/2022 | Ye et al. | |
| 2022/0301906 A1 | 9/2022 | Naik et al. | |
| 2022/0352006 A1 | 11/2022 | Huang et al. | |
| 2022/0359246 A1 | 11/2022 | Umeoka | |
| 2023/0265580 A1 | 8/2023 | Okabe | |
| 2023/0386802 A1 | 11/2023 | Cong et al. | |
| 2023/0386803 A1 | 11/2023 | Cong et al. | |
| 2023/0407478 A1 | 12/2023 | Cong et al. | |
| 2024/0234175 A9 | 7/2024 | Moradian et al. | |
| 2024/0247405 A1 | 7/2024 | Anastasopoulos et al. | |
| 2024/0254624 A1 | 8/2024 | Moradian et al. | |
| 2024/0254627 A1 | 8/2024 | Dhamodharan et al. | |
| 2024/0254654 A1 | 8/2024 | Cong et al. | |
| 2024/0254655 A1 | 8/2024 | Cong et al. | |
| 2024/0258097 A1 | 8/2024 | Patil | |

FOREIGN PATENT DOCUMENTS

| | | |
|---|---|---|
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 114927450 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| KR | 101487411 B1 | 1/2015 |
| TW | 202225468 A | 7/2022 |
| WO | 2020245493 A1 | 12/2020 |
| WO | 2022040031 A1 | 2/2022 |

OTHER PUBLICATIONS

International Search Report and Written Opinion dated May 10, 2023 for Application No. PCT/US2023/010889.

* cited by examiner

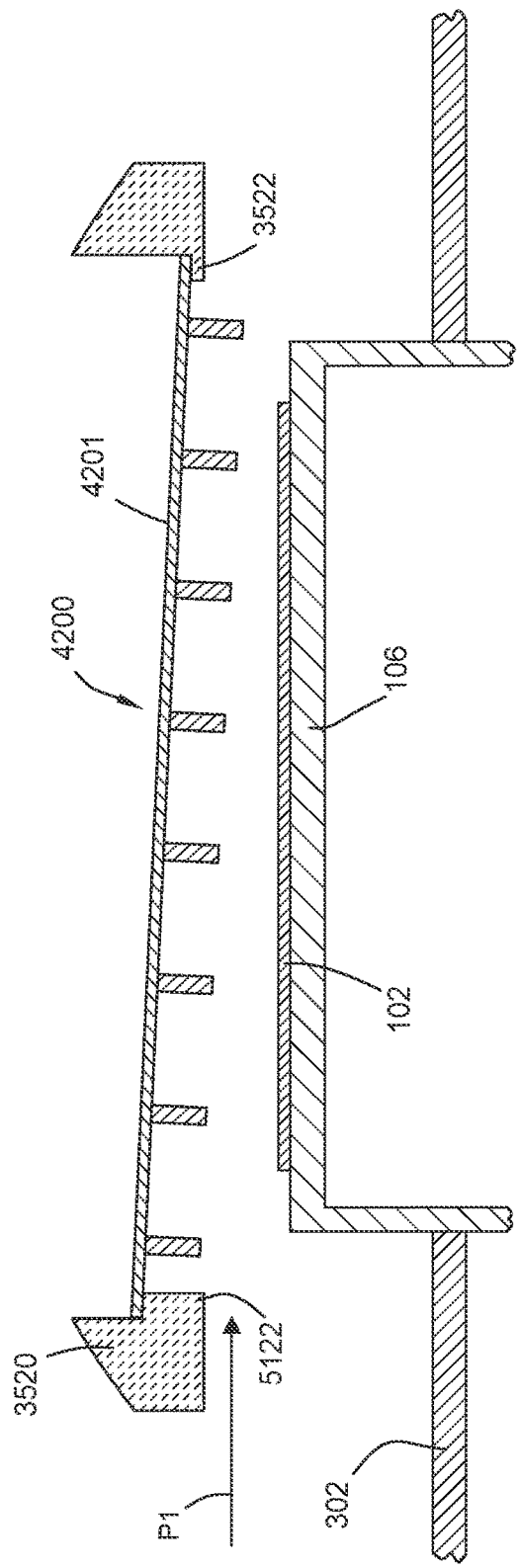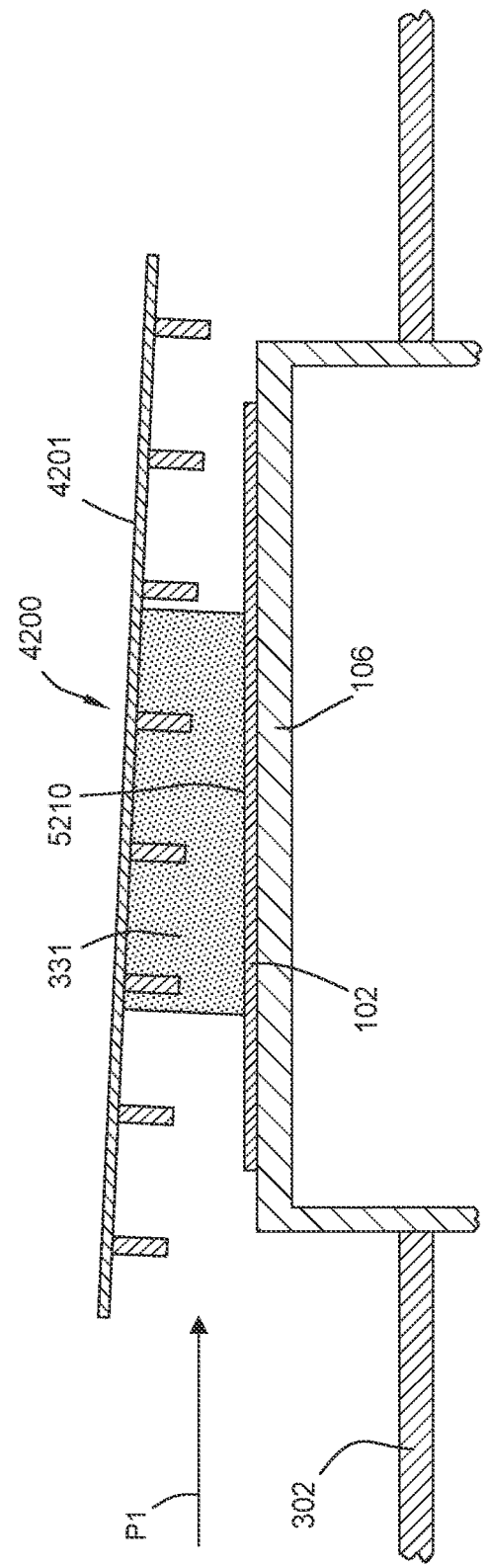

PROCESS KITS AND RELATED METHODS FOR PROCESSING CHAMBERS TO FACILITATE DEPOSITION PROCESS ADJUSTABILITY

CROSS-REFERENCE TO RELATED APPLICATION

This application claims the benefit of U.S. provisional patent application Ser. No. 63/346,681, filed May 27, 2022, which is herein incorporated by reference in its entirety.

BACKGROUND

Field

The present disclosure relates to process kits and related methods for processing chambers to facilitate deposition process adjustability.

Description of the Related Art

Semiconductor substrates are processed for a wide variety of applications, including the fabrication of integrated devices and microdevices. During processing, various parameters can affect the uniformity of material deposited on the substrate. For example, the temperature of the substrate and/or temperature(s) of processing chamber component(s) can affect deposition uniformity.

It can be difficult to adjust parameters (such as gas flow rates and gas pressures) for deposition uniformity. Rotation of the substrate, if used, can exacerbate adjustment difficulties. Relatively low rotation speeds, high pressures, and low flow rates can also exacerbate adjustment difficulties. Moreover, it can be difficult to clean components of processing chambers.

Therefore, a need exists for improved process kits and related methods that facilitate adjusting process parameters and cleaning processing chamber components, such as at low rotation speeds, high pressures, and low flow rates.

SUMMARY

The present disclosure relates to flow guides, process kits, and related methods for processing chambers to facilitate deposition process adjustment. One or more process gases flow through a rectangular flow opening while flowing over a substrate to form one or more layers on the substrate. In one or more embodiments, the rectangular flow opening is defined between a first planar inner face of a first flange and a second planar inner face of a second flange. In one or more embodiments, the flow guide includes one or more openings that can be closed and opened to allow one or more cleaning gases to flow into an internal volume defined at least partially by a window.

In one implementation, a process kit for disposition in a processing chamber applicable for use in semiconductor manufacturing includes a flow guide. The flow guide includes a middle plate having a first side and a second side opposing the first side along a first direction. The first side and the second side are arcuate. The flow guide includes a first flange extending outwardly relative to a third side of the middle plate and outwardly relative to an outer face of the middle plate, and a second flange extending outwardly relative to a fourth side of the middle plate and outwardly relative to the outer face of the middle plate. The fourth side opposes the third side along a second direction that intersects the first direction. The flow guide includes a rectangular flow opening defined between a first planar inner face of the first flange and a second planar inner face of the second flange.

In one implementation, a processing chamber applicable for use in semiconductor manufacturing includes a window at least partially defining an internal volume, a plurality of lamp, and a substrate support disposed in the internal volume. The substrate support includes a support face. The processing chamber includes a process kit disposed in the internal volume. The process kit includes a flow guide. The flow guide includes a middle plate disposed between the support face and the plurality of lamps. The middle plate has a first side and a second side opposing the first side along a first direction. The first side and the second side are arcuate. The process kit includes a first flange extending outwardly relative to a third side of the middle plate and outwardly relative to an outer face of the middle plate, and a second flange extending outwardly relative to a fourth side of the middle plate and outwardly relative to an outer face of the middle plate. The fourth side opposes the third side along a second direction that intersects the first direction. The flow guide includes a rectangular flow opening defined between a first planar inner face of the first flange and a second planar inner face of the second flange.

In one implementation, a method of processing substrates includes heating a substrate positioned on a substrate support, and flowing one or more process gases over the substrate to form one or more layers on the substrate. The flowing of the one or more process gases over the substrate includes guiding the one or more process gases through a rectangular flow opening of a process kit. The method includes lifting at least part of the process kit to open one or more first openings and one or more second openings. The method includes flowing one or more cleaning gases through the one or more first openings and into a region between the flow guide and a window, and flowing the one or more cleaning gases through the region and into the one or more second openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 51 is a schematic partial side view of the flow guide shown in FIG. 49 in a tilted position, according to one implementation.

FIG. 52 is a schematic partial side view of the flow guide shown in FIG. 49 in the tilted position, according to one implementation.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to process kits and related methods for processing chambers to facilitate deposition process adjustability. One or more process gases flow through a rectangular flow opening while flowing over a substrate to form one or more layers on the substrate. In one or more embodiments, the rectangular flow opening is defined between a first planar inner face of a first flange and a second planar inner face of a second flange. In one or more embodiments, the flow guide includes one or more openings that can be closed and opened to allow one or more cleaning gases to flow into an internal volume defined at least partially by a window.

Figure 1:
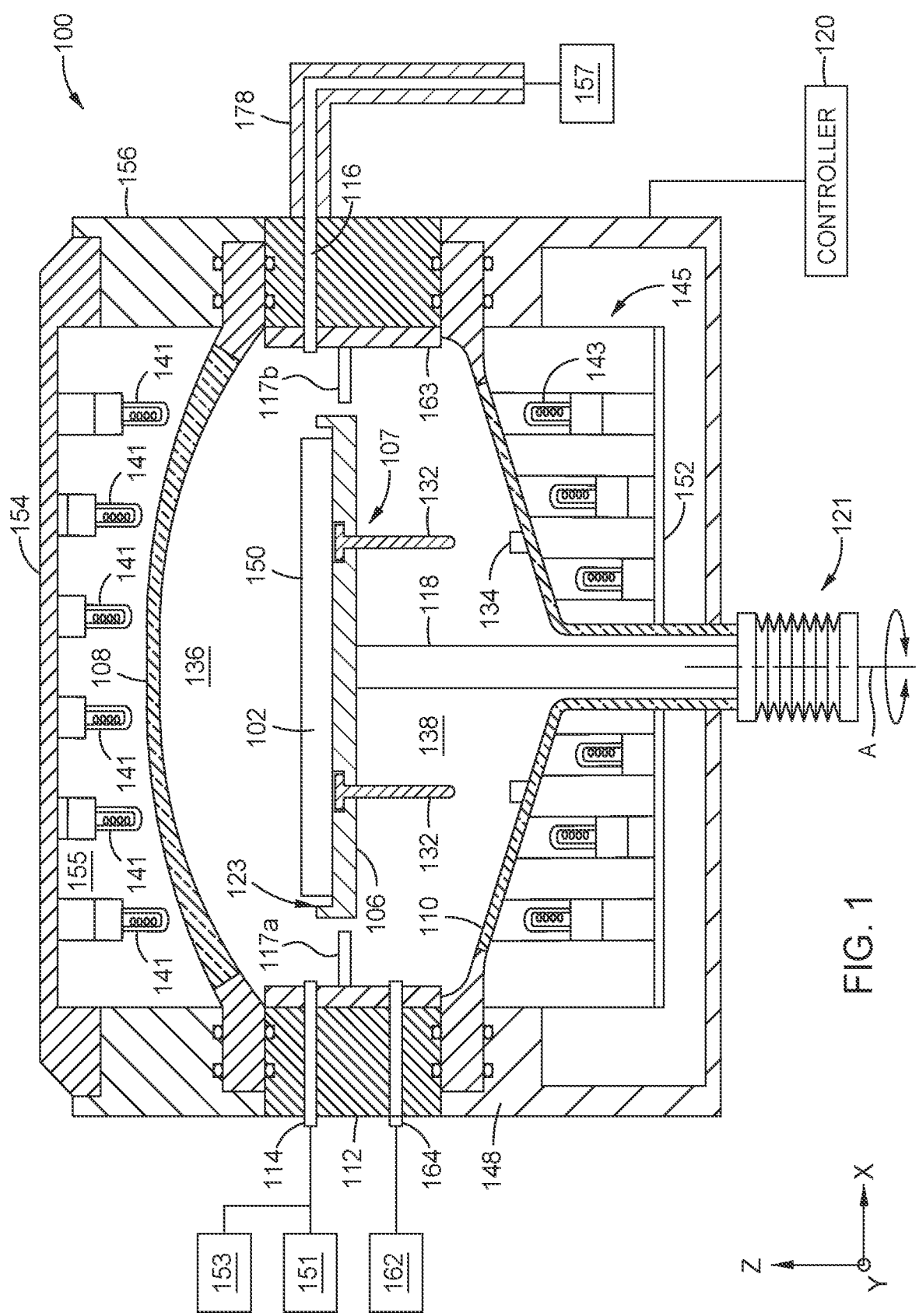
FIG. 1 is a schematic side cross-sectional view of a processing chamber, according to one implementation.

FIG. 1 is a schematic side cross-sectional view of a processing chamber 100, according to one implementation. The processing chamber 100 is a deposition chamber. In one embodiment, which can be combined with other embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102.

The processing chamber 100 includes an upper body 156, a lower body 148 disposed below the upper body 156, a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), a plurality of upper lamps 141, and a plurality of lower lamps 143. As shown, a controller 120 is in communication with the processing chamber 100 and is used to control processes and methods, such as the operations of the methods described herein.

The substrate support 106 is disposed between the upper window 108 and the lower window 110. The substrate support 106 includes a support face 123 that supports the substrate 102. The plurality of upper lamps 141 are disposed between the upper window and a lid 154. The plurality of upper lamps 141 form a portion of the upper lamp module 155. The lid 154 may include a plurality of sensors (not shown) disposed therein for measuring the temperature within the processing chamber 100. The plurality of lower lamps 143 are disposed between the lower window 110 and a floor 152. The plurality of lower lamps 143 form a portion of a lower lamp module 145. The upper window 108 is an upper dome and is formed of an energy transmissive material, such as quartz. The lower window 110 is a lower dome and is formed of an energy transmissive material, such as quartz.

A process volume 136 and a purge volume 138 are formed between the upper window 108 and the lower window 110. The process volume 136 and the purge volume 138 are part of an internal volume defined at least partially by the upper window 108, the lower window 110, and the one or more liners 163.

The internal volume has the substrate support 106 disposed therein. The substrate support 106 includes a top surface on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106 within the processing volume 136.

The substrate support 106 may include lift pin holes 107 disposed therein. The lift pin holes 107 are sized to accommodate a lift pin 132 for lifting of the substrate 102 from the substrate support 106 either before or after a deposition process is performed. The lift pins 132 may rest on lift pin stops 134 when the substrate support 106 is lowered from a process position to a transfer position.

The flow module 112 includes a plurality of gas inlets 114, a plurality of purge gas inlets 164, and one or more gas exhaust outlets 116. The plurality of gas inlets 114 and the plurality of purge gas inlets 164 are disposed on the opposite side of the flow module 112 from the one or more gas exhaust outlets 116. One or more flow guides 117a, 117b are disposed below the plurality of gas inlets 114 and the one or more gas exhaust outlets 116. The one or more flow guides 117a, 117b are disposed above the purge gas inlets 164. One or more liners 163 are disposed on an inner surface of the flow module 112 and protects the flow module 112 from reactive gases used during deposition operations and/or cleaning operations. The gas inlet(s) 114 and the purge gas inlet(s) 164 are each positioned to flow a gas parallel to the top surface 150 of a substrate 102 disposed within the process volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), and/or nitrogen ($N_2$)). One or more cleaning gases supplied using the one or more cleaning gas sources 153 can include one or more of hydrogen (H) and/or chlorine (Cl). In one embodiment, which can be combined with other embodiments, the one or more process gases include silicon phosphide (SiP) and/or phospine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

Figure 2:
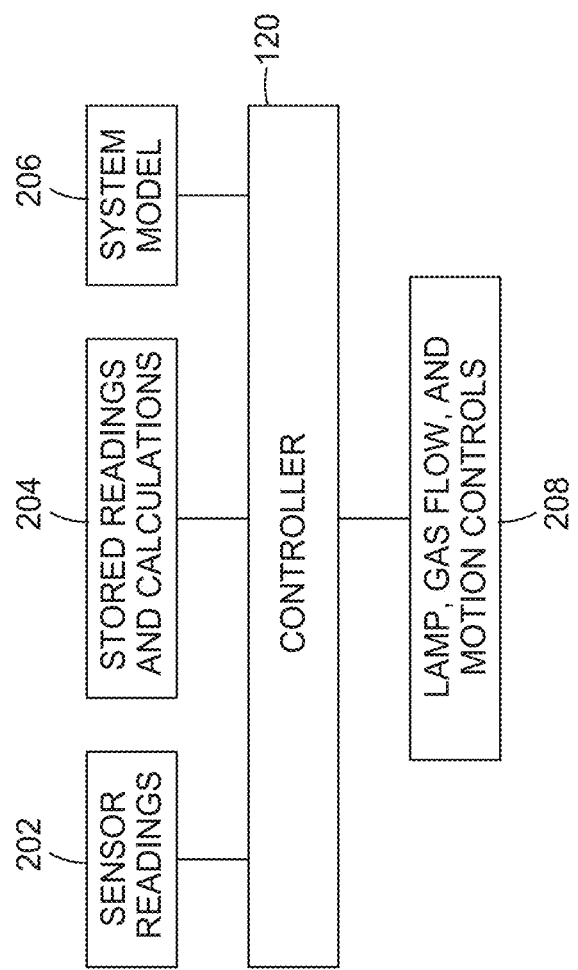
FIG. 2 is a schematic block view of a control system for use within the processing chamber shown in FIG. 1, according to one implementation.

FIG. 2 is a schematic block view of a control system 200 for use within the processing chamber 100 shown in FIG. 1, according to one implementation. The controller 120 is configured to receive data or input as sensor readings 202 from a plurality of sensors. The sensors can include, for example, sensors that monitor growth of layer(s) on the substrate 102 and/or sensors that monitor growth or residue on inner surfaces of chamber components of the processing chamber 100 (such as inner surfaces of the upper window 108 and the one or more liners 163). The controller 120 is equipped with or in communication with a system model 206 of the processing chamber 100. The system model 206 includes a heating model, a rotational position model, and a gas flow model. The system model 206 is a program configured to estimate parameters (such as the gas flow rate, the gas pressure, the rotational position of component(s), and the heating profile) within the processing chamber 100 throughout a deposition operation and/or a cleaning operation. The controller 120 is further configured to store readings and calculations 204.

The readings and calculations 204 include previous sensor readings 202, such as any previous sensor readings within the processing chamber 100. The readings and calculations 204 further include the stored calculated values from after the sensor readings 202 are measured by the controller 120 and run through the system model 206. Therefore, the controller 120 is configured to both retrieve stored readings and calculations 204 as well as save readings and calculations 204 for future use. Maintaining previous readings and calculations enables the controller 120 to adjust the system model 206 over time to reflect a more accurate version of the processing chamber 100.

The controller 120 includes a central processing unit (CPU), a memory containing instructions, and support circuits for the CPU. The controller 120 controls various items directly, or via other computers and/or controllers. In one or more embodiments, the controller 120 is communicatively coupled to dedicated controllers, and the controller 120 functions as a central controller.

The controller 120 is of any form of a general-purpose computer processor that is used in an industrial setting for controlling various substrate processing chambers and equipment, and sub-processors thereon or therein. The memory, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits of the controller 120 are coupled to the CPU for supporting the CPU (a processor). The support circuits include cache, power supplies, clock circuits, input/output circuitry and subsystems, and the like. Operational parameters (a pressure for process gas, a flow rate for process gas, and/or a rotational position of a process kit) and operations are stored in the memory as a software routine that is executed or invoked to turn the controller 120 into a specific purpose controller to control the operations of the various chambers/modules described herein. The controller 120 is configured to conduct any of the operations described herein. The instructions stored on the memory, when executed, cause one or more of operations of method 3400 (described below) to be conducted.

The various operations described herein (such as the operations of the method 3400) can be conducted automatically using the controller 120, or can be conducted automatically or manually with certain operations conducted by a user.

In one or more embodiments, the controller 120 includes a mass storage device, an input control unit, and a display unit (not shown). The controller 120 monitors the process gas, and purge gas flow. In one or more embodiments, the controller 120 includes multiple controllers 120, such that the stored readings and calculations 204 and the system model 206 are stored within a separate controller from the controller 120 which operations the processing chamber 100. In one or more embodiments all of the system model 206 and the stored readings and calculations 204 are saved within the controller 120.

The controller 120 is configured to control the rotational position, the heating, and gas flow through the processing chamber 100 by providing an output to the controls 208 for the lamps, the gas flow, and the motion assembly 121. The controls 208 include controls for the upper lamps 141, the lower lamps 143, the process gas source 151, the purge gas source 162, the motion assembly 121, and the exhaust pump 157.

The controller 120 is configured to adjust the output to the controls 208 based off of the sensor readings 202, the system model 206, and the stored readings and calculations 204. The controller 120 includes embedded software and a compensation algorithm to calibrate measurements. The controller 120 can include one or more machine learning algorithms and/or artificial intelligence algorithms that estimate optimized parameters for the deposition operation and/or the cleaning operations. The one or more machine learning algorithms and/or artificial intelligence algorithms can use, for example, a regression model (such as a linear regression model) or a clustering technique to estimate optimized parameters. The algorithm can be unsupervised or supervised.

Figure 3:
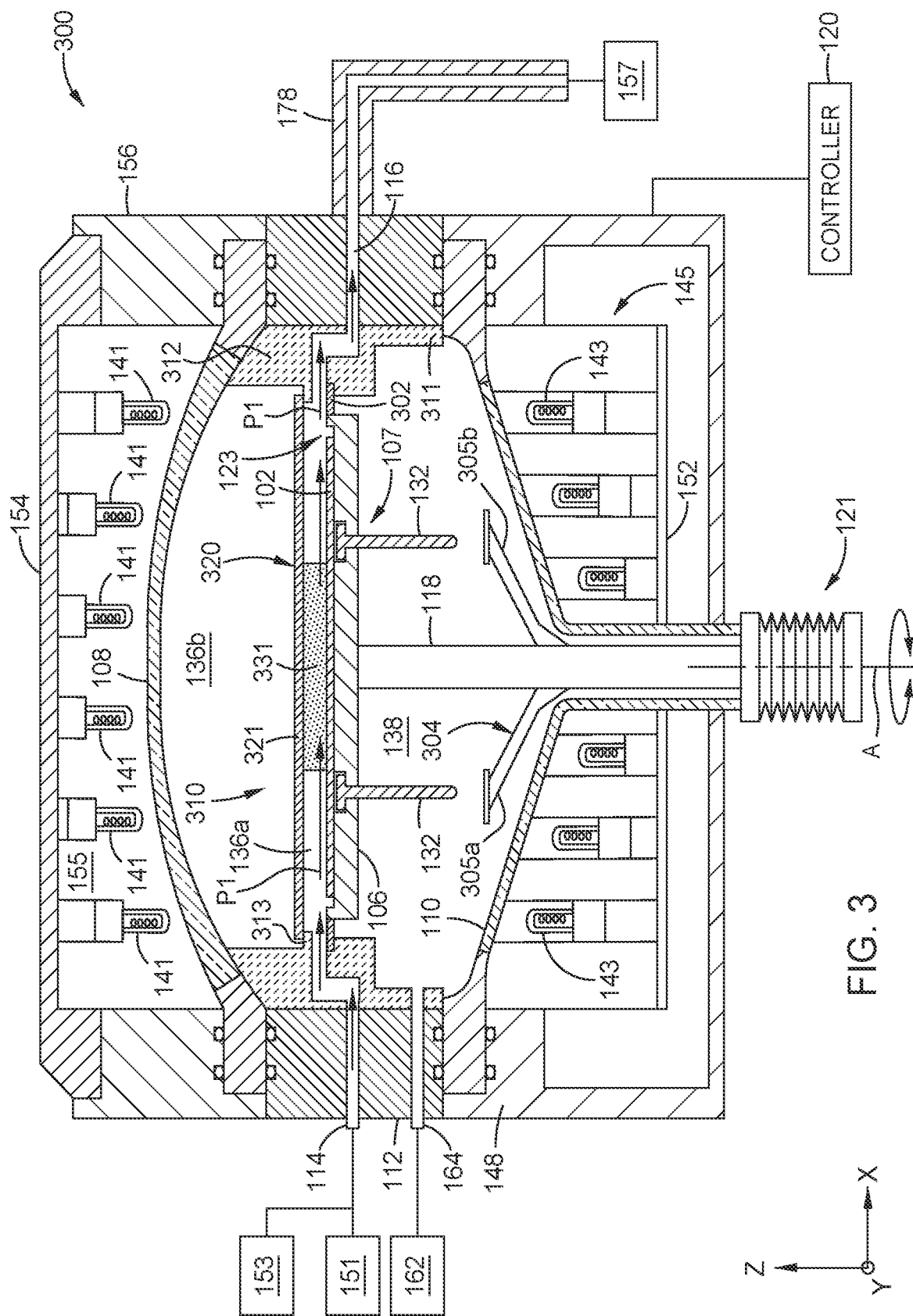
FIG. 3 is a partial schematic side cross-sectional view of a processing chamber with a process kit in a processing position, according to one implementation.

FIG. 3 is a partial schematic side cross-sectional view of a processing chamber 300 with a process kit 310 in a processing position, according to one implementation. The processing chamber 300 is similar to the processing chamber 100 shown in FIG. 1, and includes one or more of the aspects, features, components, properties, and/or operations thereof.

The process kit 310 is disposed in the process volume 136 of the internal volume of the processing chamber 300. The process kit 310 includes a flow guide 320. The flow guide 320 includes a middle plate 321 disposed between the support face 123 and the upper lamps 141. One flange 331 (described below) of the process kit 310 is shown in FIG. 3. The processing chamber 300 includes a lower liner 311 aligned at least partially below the substrate support 106 and an upper liner 312 aligned at least partially above the substrate support 106. A pre-heat ring 302 is disposed outwardly of the substrate support 106. The pre-heat ring 302 is supported on a ledge of the lower liner 311. A stop 304 includes a plurality of arms 305a, 305b that each include a lift pin stop on which the lift pins 132 can rest when lowered.

In the processing position shown in FIG. 3, the process kit 310 is in a lower position. In the processing position, the middle plate 321 is supported (e.g., rests) on a ledge 313 of the upper liner 312. In the processing position, the middle plate 321 effectively seals a lower portion 136a of the processing volume 136 from an upper portion 136b of the processing volume 136. In one embodiment, which can be combined with other embodiments, the flanges 331, 332 (described below) are partially supported on the substrate support 106 and partially supported on the pre-heat ring 302 in the processing position. In such an embodiment, raising of the substrate support 106 can lift the process kit 310 away from the pre-heat ring 302.

One or more process gases P1 flow from the process gas inlets, into the lower portion 136a, and over the substrate 102 to form (e.g., epitaxially grow) one or more layers on the substrate 102 while the lamps 141, 143 heat the pre-heat ring 302 and the substrate 102. After flowing over the substrate 102, the one or more process gases P1 flow out of the internal volume through the one or more gas exhaust outlets 116.

Figure 4:
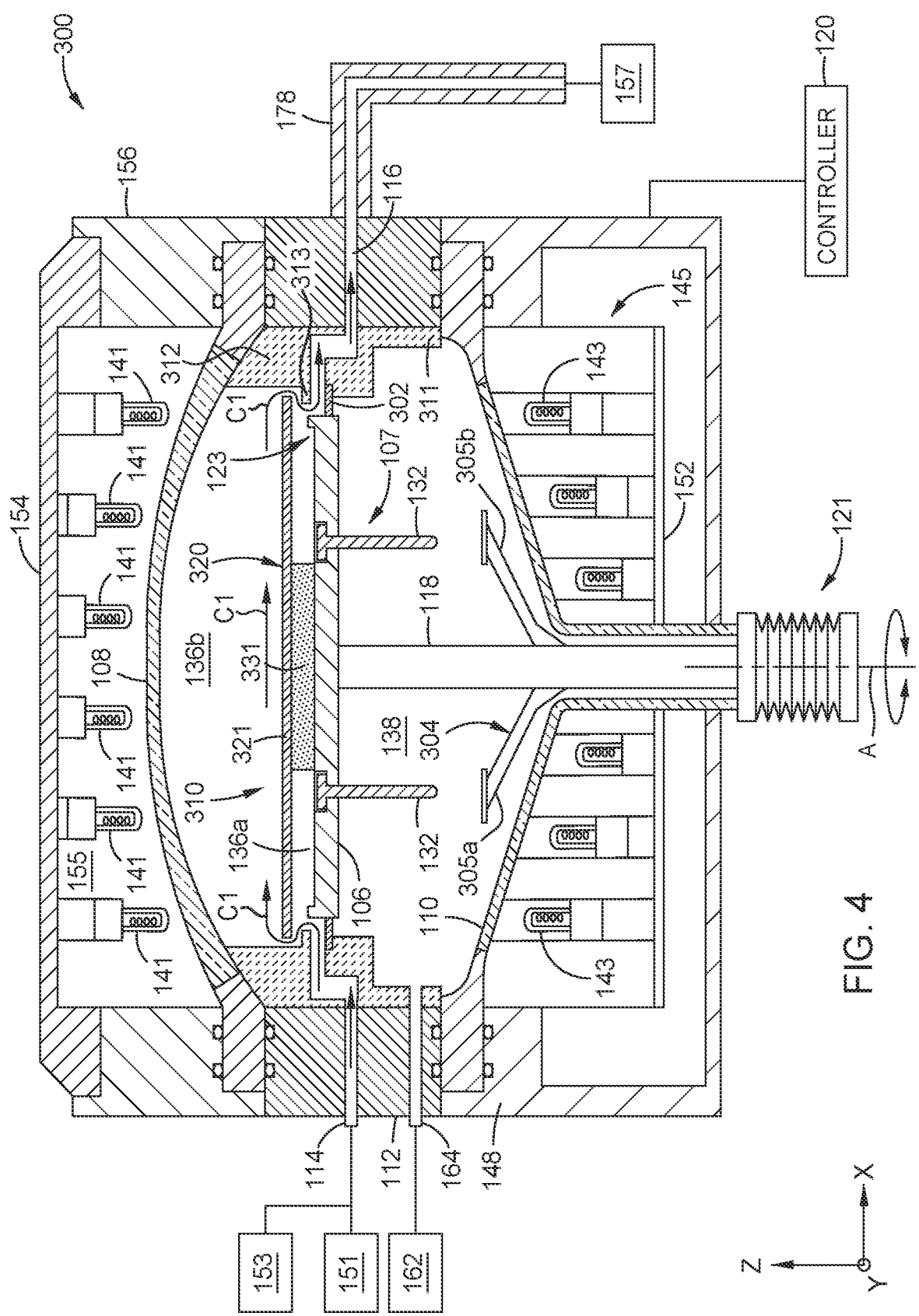
FIG. 4 is a partial schematic side cross-sectional view of the processing chamber with the process kit (shown in FIG. 3) in a cleaning position, according to one implementation.

FIG. 4 is a partial schematic side cross-sectional view of the processing chamber 300 with the process kit 310 (shown in FIG. 3) in a cleaning position, according to one implementation. In FIG. 4, the cleaning position is a raised position relative to the processing position shown in FIG. 3.

In the cleaning position in FIG. 4, the substrate 102 has been removed from the internal volume of the processing chamber 300. Using raising of the substrate support 106, the process kit 310 has been raised such that the middle plate 321 is raised to be at a gap from the ledge 313 of the upper liner 312 at both the first side 322 and the second side 323.

The gaps herein can be also referred to as openings. One or more cleaning gases C1 are supplied into the processing volume 136 through the gas inlets 114. At least part of the one or more cleaning gases C1 flow through the gap between the middle plate 321 and the ledge 313, and into the upper portion 136b. The one or more cleaning gases C1 flowing into the upper portion 136b facilitates cleaning inner surfaces of the processing chamber 300, such as inner surfaces of the upper liner 312 and the upper window 108, and a surface of the middle plate 321 that faces the upper window 108. The one or more cleaning gases C1 clean a space (e.g., the upper portion 136b) that is between the middle plate 321 and the upper window 108. The one or more cleaning gases C1 flow through the upper portion 136b, through the gap on the opposing side of the processing chamber 300, and out of the internal volume through the one or more gas exhaust outlets 116.

Figure 5:
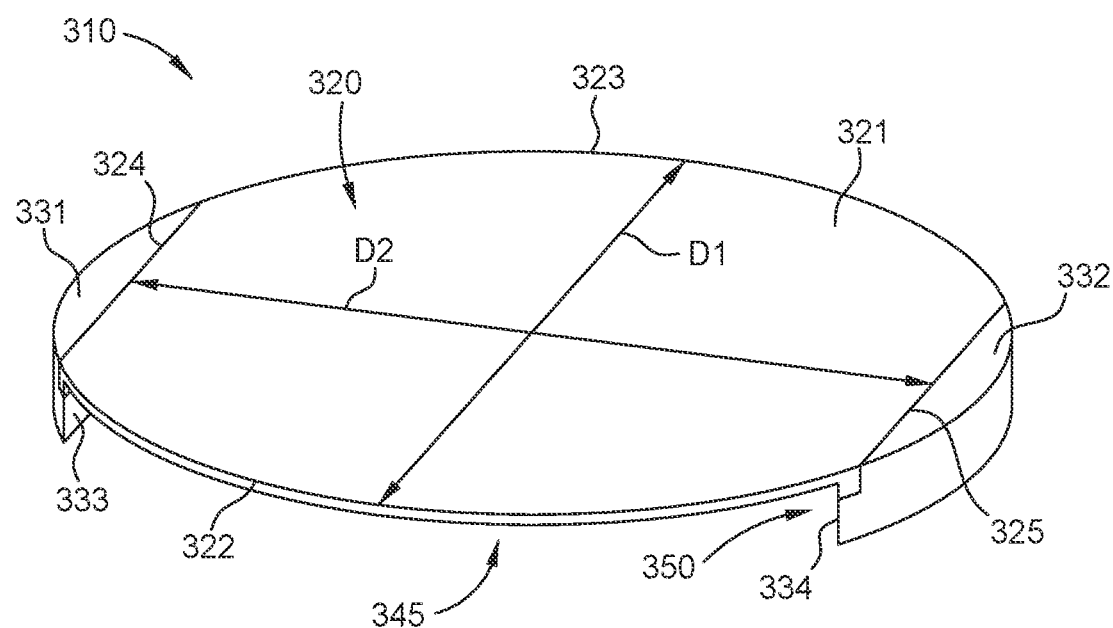
FIG. 5 is a schematic partial perspective view of the process kit shown in FIGS. 3 and 4, according to one implementation.

FIG. 5 is a schematic partial perspective view of the process kit 310 shown in FIGS. 3 and 4, according to one implementation.

The middle plate 321 has a first side 322 (adjacent the gas inlets 114 in FIGS. 3 and 4) and a second side 323 opposing the first side 322 along a first direction D1. Each of the first side 322 and the second side 323 is arcuate.

The process kit 310 incudes a first flange 331 extending outwardly relative to a third side 324 of the middle plate 321 and outwardly relative to an outer face 345 of the middle plate 321, and a second flange 332 extending outwardly relative to a fourth side 325 of the middle plate 321 and outwardly relative to the outer face 345 of the middle plate 321. The fourth side 325 opposes the third side 324 along a second direction D2 that intersects the first direction D1. In one or more embodiments, the second direction D2 is perpendicular to the first direction D1. The third side 324 and the fourth side 325 are linear. In FIGS. 3 and 4, the first and second flanges 331, 332 are supported at least partially on the substrate support 106 such that raising and lowering of the substrate support 106 raises and lowers the process kit 310. A rectangular flow opening 350 is defined between a first planar inner face 333 of the first flange 331 and a second planar inner face 334 of the second flange 332. Each of the first flange 331 and the second flange 332 is semi-circular in shape. In one embodiment, which can be combined with other embodiments, the middle plate 231 is formed of quartz and the first and second flanges 331, 332 are each formed of silicon carbide (SiC). The rectangular flow opening 350 has a 3-D rectangular box shape such that the rectangular flow opening 350 has a rectangular shape in each of the X-Y plane, the X-Z plane, and the Y-Z plane. When the process kit 310 is in the processing position, the rectangular flow opening 350 is defined by one or more of the first planar inner face 333, the second planar inner face 334, an upper surface of the substrate 102, an upper surface of the substrate support 106, and/or an upper surface of the pre-heat ring 302.

The one or more process gases P1 flow through the rectangular flow opening 350 when flowing through the lower portion 136a and over the substrate 102. The rectangular flow opening 350 facilitates adjustability of process gases and cleaning gases (such as pressure and flow rate), to facilitate process uniformity and deposition uniformity while providing a path for cleaning gases to the upper portion 136b. As an example, the rectangular flow opening 350 facilitates using high pressures and low flow rates for the process gases and the cleaning gases. The rectangular flow opening 350 also facilitates mitigation of the effects that rotation of the substrate 102 has on process uniformity and film thickness uniformity during a deposition operation. As an example, the rectangular flow opening mitigates or removes the effects of gas vortex.

Figure 6:
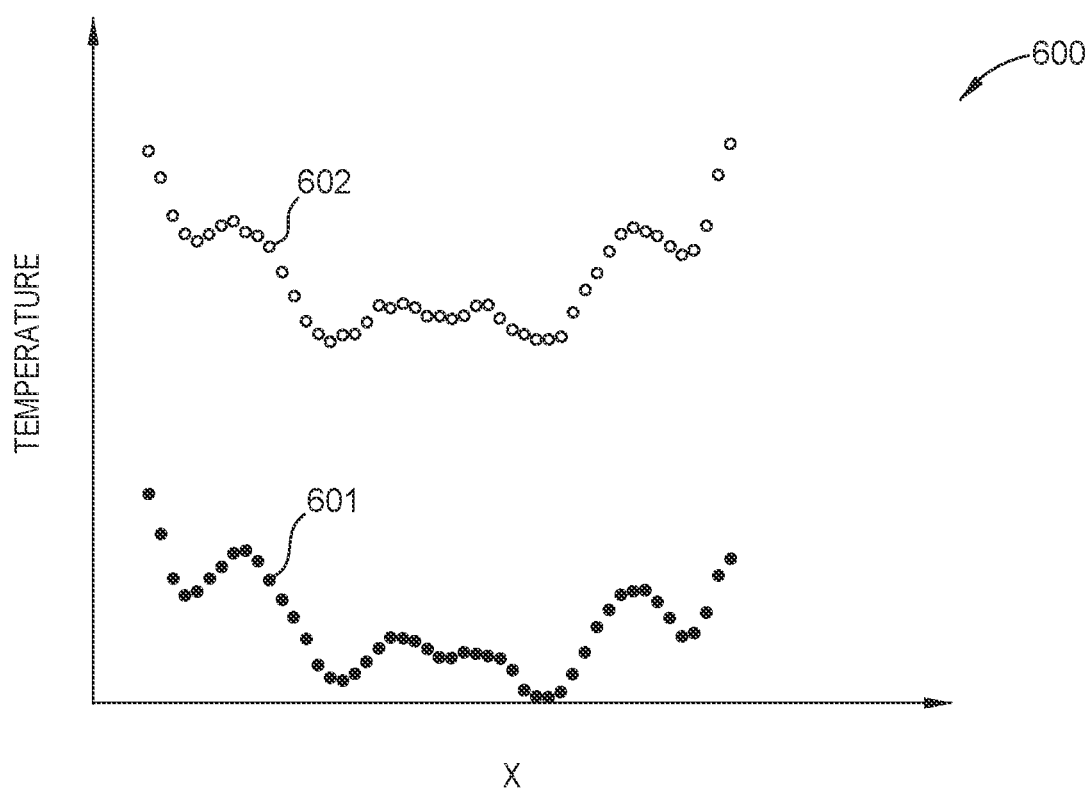
FIG. 6 is a schematic graphical view of a graph plotting temperature versus an x-position, according to one implementation.

FIG. 6 is a schematic graphical view of a graph 600 plotting temperature versus an x-position, according to one implementation. The temperature represents a temperature of the substrate support 106 taken at a variety of x-positions. The x-positions are taken along a diameter of the substrate support 106.

For a first profile 601, the process kit 310 was not included in the processing chamber. For a second profile 602, the process kit 310 was included in the processing chamber. As shown by the second profile 602, process uniformity and mitigated effects of substrate rotation exhibit higher temperatures for the substrate support 106 to facilitate using lower power levels for the heat lamps. Using lower power levels facilitates reduced costs and operational efficiencies.

Figure 7:
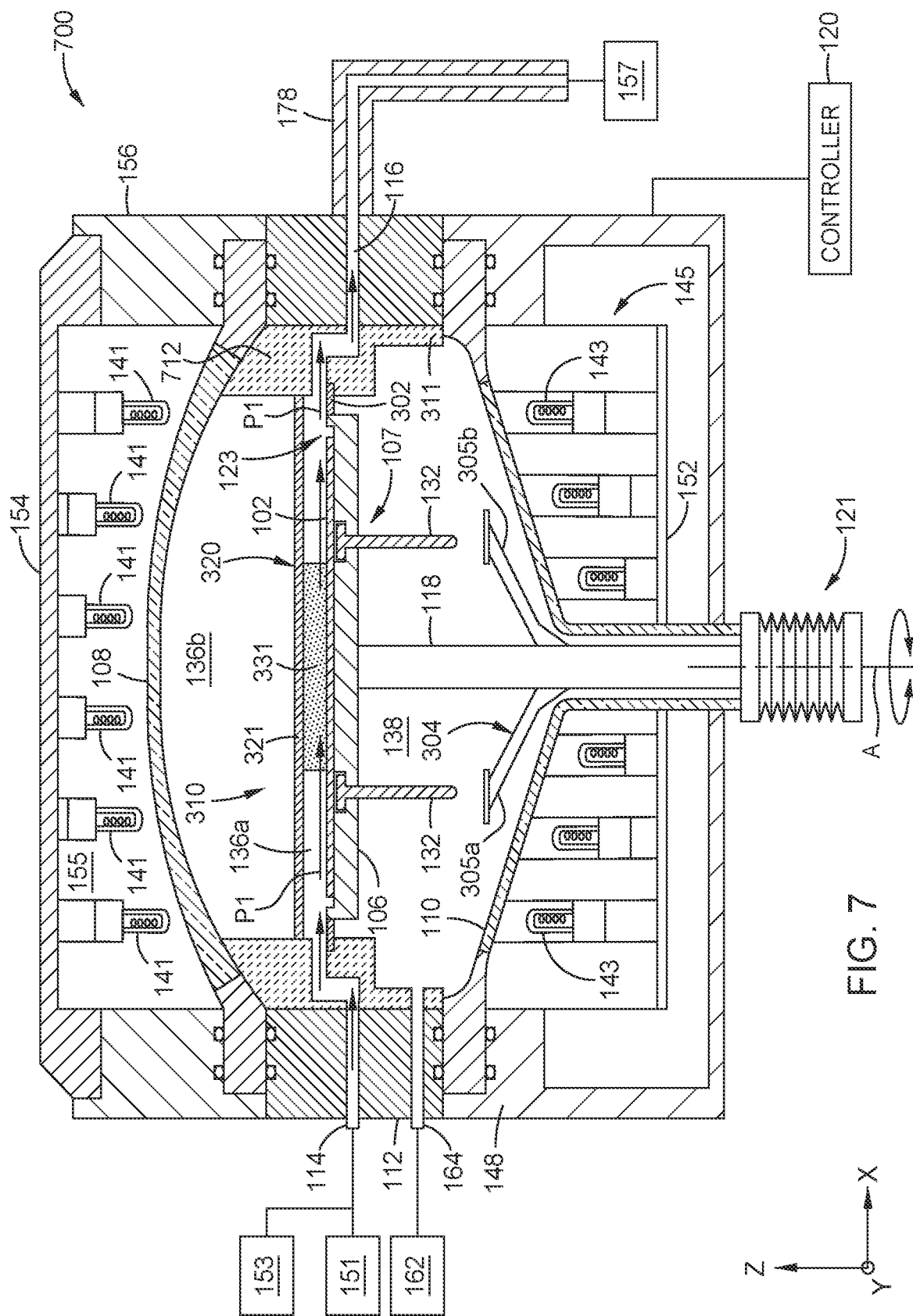
FIG. 7 is a partial schematic side cross-sectional view of a processing chamber with the process kit in a processing position, according to one implementation.

FIG. 7 is a partial schematic side cross-sectional view of a processing chamber 700 with the process kit 310 in a processing position, according to one implementation. The processing chamber 700 is similar to the processing chamber 300 shown in FIG. 3, and includes one or more of the aspects, features, components, properties, and/or operations thereof.

In FIG. 7, the processing position is a raised position. The processing chamber 700 includes an upper liner 712. The upper liner 712 is similar to the upper liner 312 shown in FIG. 3, and includes one or more of the aspects, features, components, properties, and/or operations thereof.

The ledge 313 is omitted from the upper liner 712 such that the middle plate 321 can lower downwardly past the upper liner 712. The middle plate 321 is free floating relative to the upper liner 712.

Figure 8:
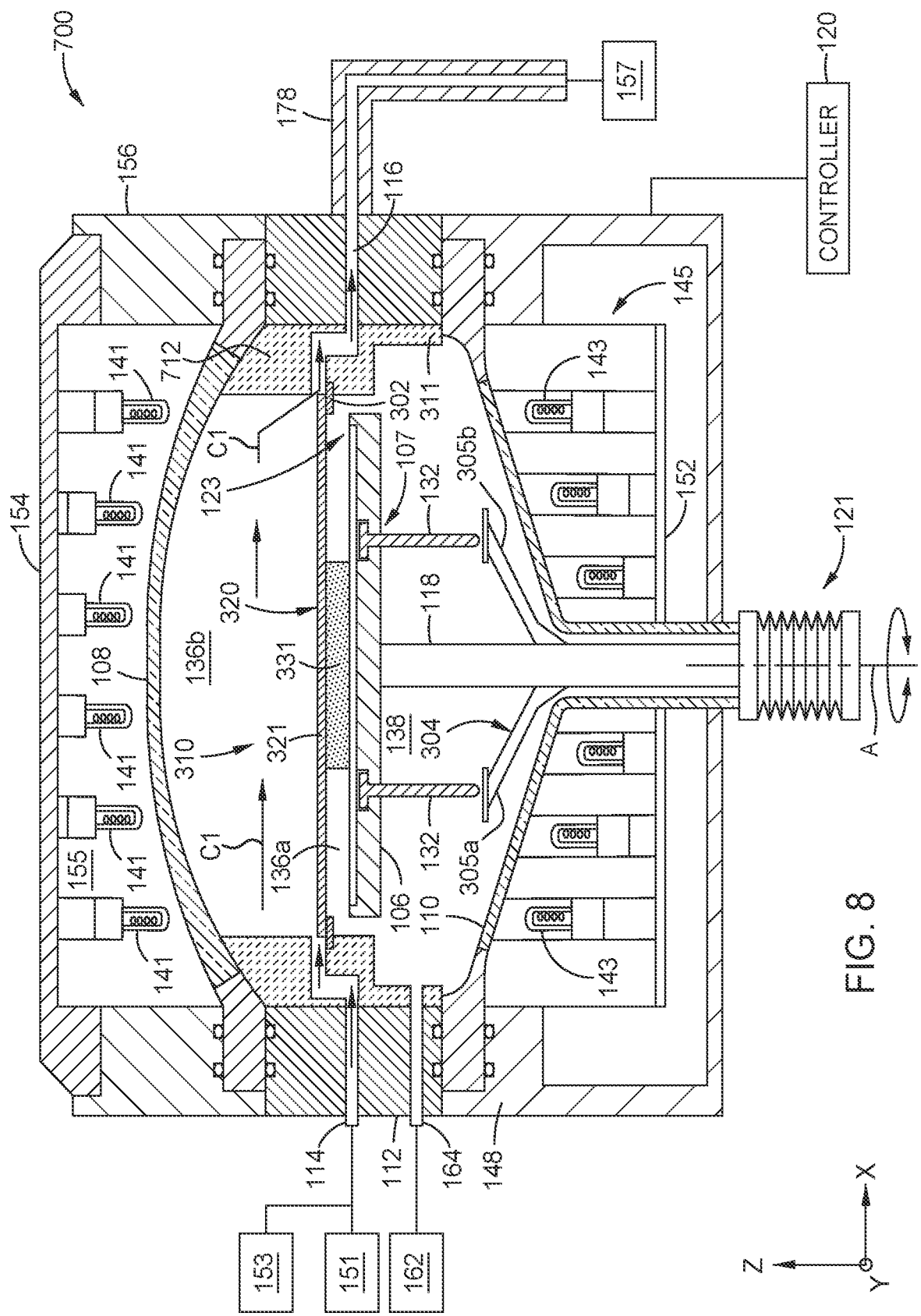
FIG. 8 is a partial schematic side cross-sectional view of the processing chamber with the process kit (shown in FIG. 7) in a cleaning position, according to one implementation.

FIG. 8 is a partial schematic side cross-sectional view of the processing chamber 700 with the process kit 310 (shown in FIG. 7) in a cleaning position, according to one implementation. In FIG. 8, the cleaning position is a lowered position relative to the processing position shown in FIG. 7.

In the cleaning position in FIG. 4, the substrate 102 has been removed from the internal volume of the processing chamber 300. Using lowering of the substrate support 106, the process kit 310 has been lowered such that the middle plate 321 is lowered to be at a gap from the upper liner 712. One or more cleaning gases C1 are supplied into the processing volume 136 through the gas inlets 114. At least part of the one or more cleaning gases C1 flow through the gap between the middle plate 321 and the upper liner 712, and into the upper portion 136b.

Figure 9:
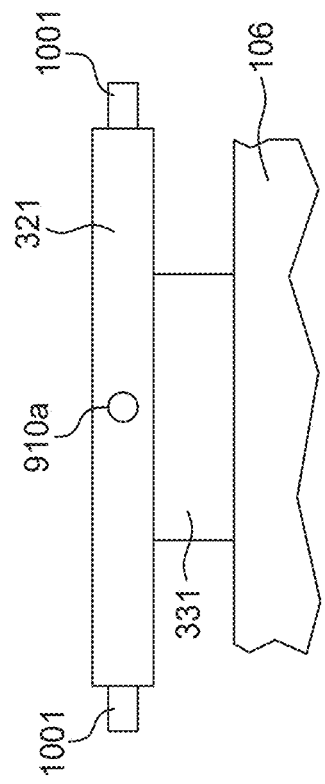
FIG. 9 is a partial schematic side cross-sectional view of the upper liner, according to one implementation.

FIG. 9 is a partial schematic side cross-sectional view of the upper liner 312, according to one implementation.

Figure 10:
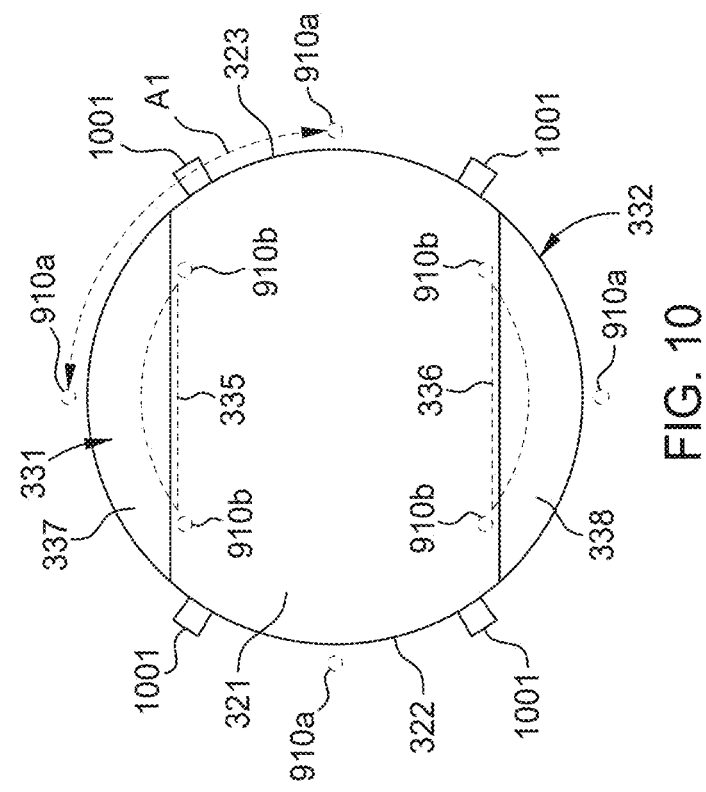
FIG. 10 is a schematic top view of the process kit, according to one implementation.

FIG. 10 is a schematic top view of the process kit 310, according to one implementation. The process kit 310 includes a plurality of lock extensions 1001 extending outwardly relative to the middle plate 321. The lock extensions 1001 are attached to the middle plate 321 or integrally formed with the middle plate 321. The lock extensions 1001 extend from the first and second sides 322, 323. The present disclosure contemplates that the lock extensions 1001 can extend from a top surface of the middle plate 321.

In the implementation shown in FIG. 9, the upper liner 312 includes two levels of lock stop structures 910a, 910b facing inwardly. A set of the lock stop structures 910a, 910b can be included for each lock extension 1001 (as shown in FIG. 10). In one embodiment, which can be combined with other embodiments, the upper liner 312 includes four sets of lock stop structures 910a, 910b (as shown in FIG. 10). Inner lock stop structures 910b prevent the process kit 310 from rotating when the process kit 310 is in the lower position by providing stops for the flanges 331, 332.

Two of outer lock stop structures 910a defines a first radial boundary and a second radial boundary between which a respective lock extension 1001 can move along a rotational path by a rotation angle A1. The process kit 310 can rotate by an angle up to the rotation angle A1 when the process kit is in the upper position such that the flanges 331, 332 clear the inner lock stop structures 910b (as shown in ghost in FIG. 9). The process kit 310 can be rotated when in the raised position, for example, prior to lowering the process kit 310 such that the middle plate 321 is supported on a component (such as the upper liner 312). The rotation of the process kit 310 can be used to adjust the orientation of the rectangular flow opening 350 between deposition operations and/or between cleaning operations, which facilitates adjustability of the gases and uniformity of the deposition and/or cleaning.

The inner lock stop structures 910b and the outer lock stop structures 910a can be disposed in respective channels formed in an inner face of the upper liner 312.

Each of the first flange 331 and the second flange 332 can include a respective protrusion section 335, 336 that interfaces with the substrate support 106. In one embodiment, which can be combined with other embodiments, the substrate support 106 raises and interfaces with the protrusion sections 335, 336 to lift outer sections 337, 338 of the first and second flanges 331, 332 off of the pre-heat ring 302.

Figure 11:
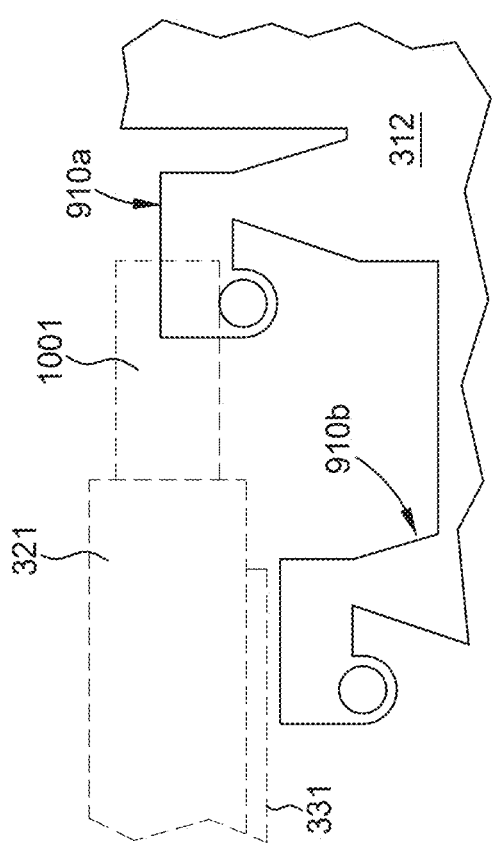
FIG. 11 is a schematic side view of the lock extensions shown in FIG. 10, according to one implementation.

FIG. 11 is a schematic side view of the lock extensions 1001 shown in FIG. 10, according to one implementation.

Figure 12:
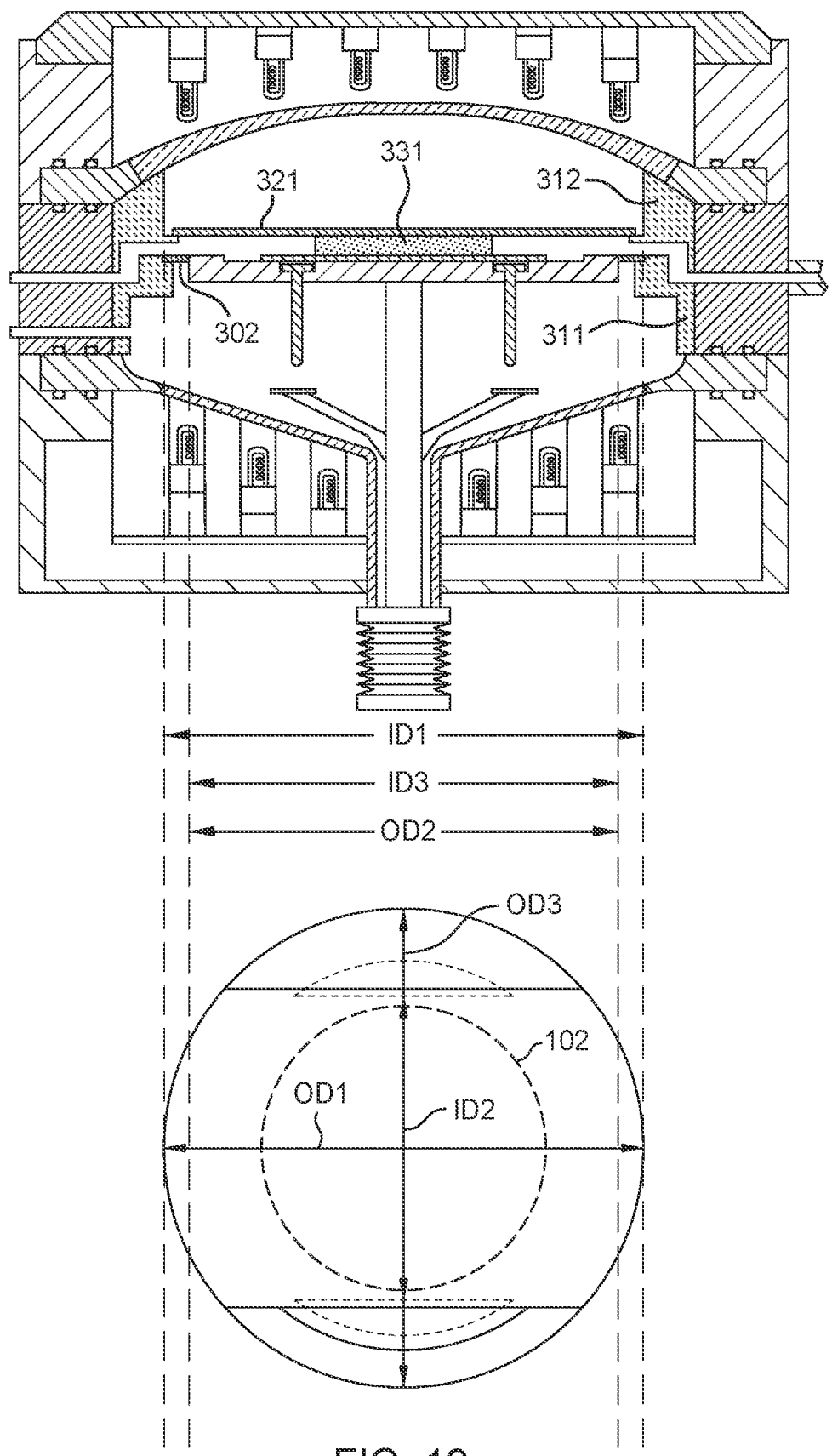
FIG. 12 is a schematic top plan view of the spatial configuration of the process kit disposed in the processing chamber, according to one implementation.

FIG. 12 is a schematic top plan view of the spatial configuration of the process kit 310 disposed in the processing chamber 300, according to one implementation.

An outer diameter OD1 of the middle plate 321 is equal to or lesser than an inner diameter ID1 of the upper liner 312. An inner diameter ID2 between inner edges of the flanges 331, 332 is lesser than an outer diameter OD2 of the substrate support 106. An outer diameter OD3 between outer edges of the flanges 331, 332 is greater than an inner diameter ID3 of the pre-heat ring 302.

Figure 13:
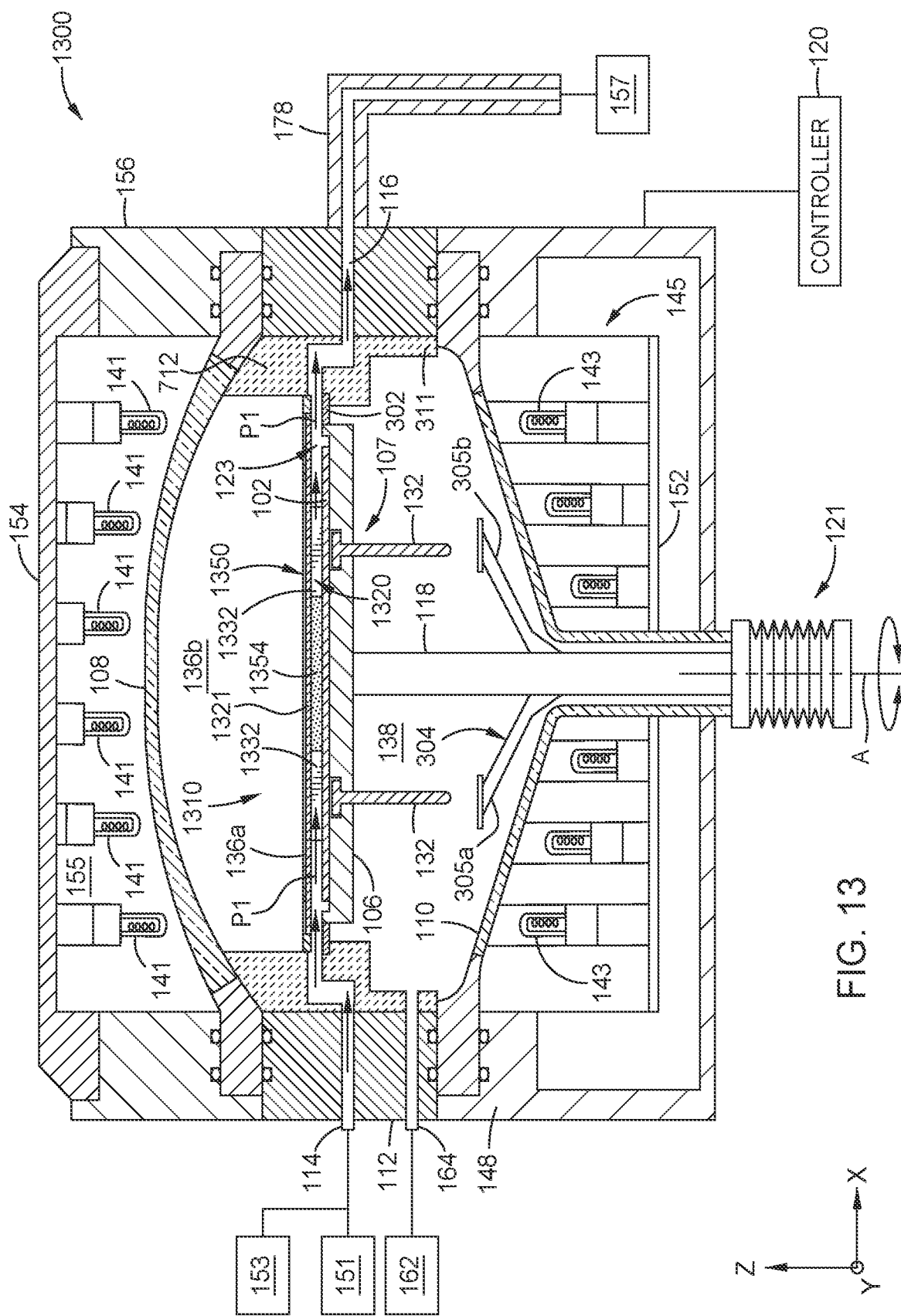
FIG. 13 is a partial schematic side cross-sectional view of a processing chamber with a process kit in a processing position, according to one implementation.

FIG. 13 is a partial schematic side cross-sectional view of a processing chamber 1300 with a process kit 1310 in a processing position, according to one implementation.

Figure 14:
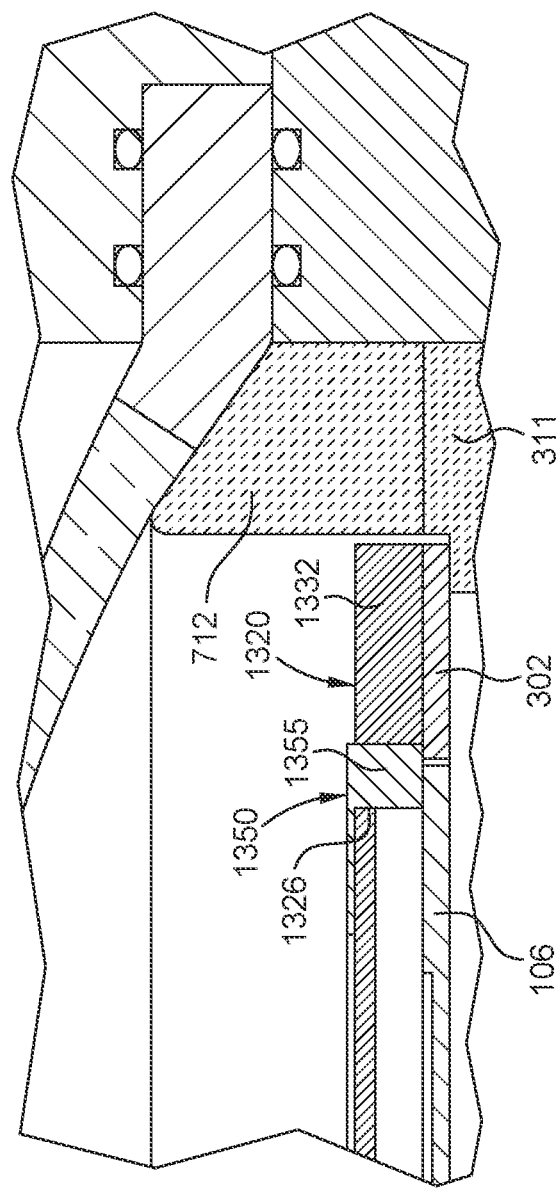
FIG. 14 is an enlarged cross-sectional view of the processing chamber shown in FIG. 13, according to one implementation.

FIG. 14 is an enlarged cross-sectional view of the processing chamber 1300 shown in FIG. 13, according to one implementation. The cross-sectional view of FIG. 14 is taken along a different radial angle than the cross-sectional view shown in FIG. 13.

The processing chamber 1300 is similar to the processing chamber 300 shown in FIG. 3, and includes one or more of the aspects, features, components, properties, and/or operations thereof. The process kit 1310 is similar to the process kit 310 shown in FIG. 3, and includes one or more of the aspects, features, components, properties, and/or operations thereof.

The process kit 1310 includes a flow guide 1320 and a cover 1350. In FIGS. 13 and 14 the cover 1350 is in a lowered position to effectively seal the upper portion 136b from the lower portion 136a of the process volume 136. The ledge 313 is omitted from the upper liner 712 such that the middle plate 321 can lower downwardly past the upper liner 712. The middle plate 321 is free floating relative to the upper liner 712. Flanges 1331, 1332 (described below) of the flow guide 1320 are supported on the pre-heat ring 302. The cover 1350 includes protrusions 1354, 1355 (discussed below) extending into openings 1325, 1326 (discussed below) of the flow guide 1320.

Lifting of the substrate support 106 engages the substrate support 106 with the protrusions 1354, 1355 to raise the cover 1350 relative to the flow guide 1320.

Figure 15:
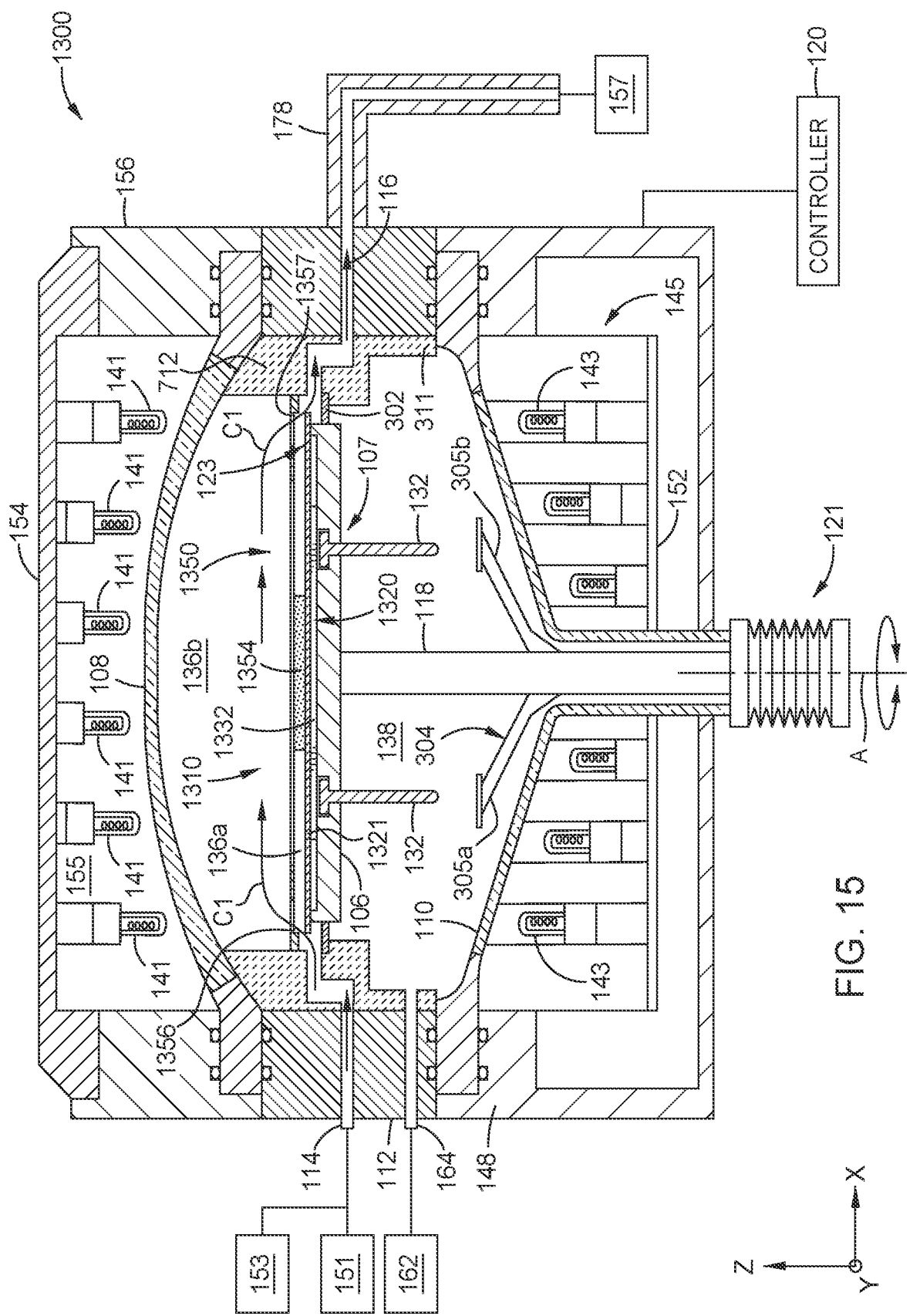
FIG. 15 is a partial schematic side cross-sectional view of the processing chamber with the process kit (shown in FIG. 13) in a cleaning position, according to one implementation.

FIG. 15 is a partial schematic side cross-sectional view of the processing chamber 1300 with the process kit 1310 (shown in FIG. 13) in a cleaning position, according to one implementation.

In FIG. 15, the cleaning position is a raised position relative to the processing position shown in FIG. 13.

Figure 16:
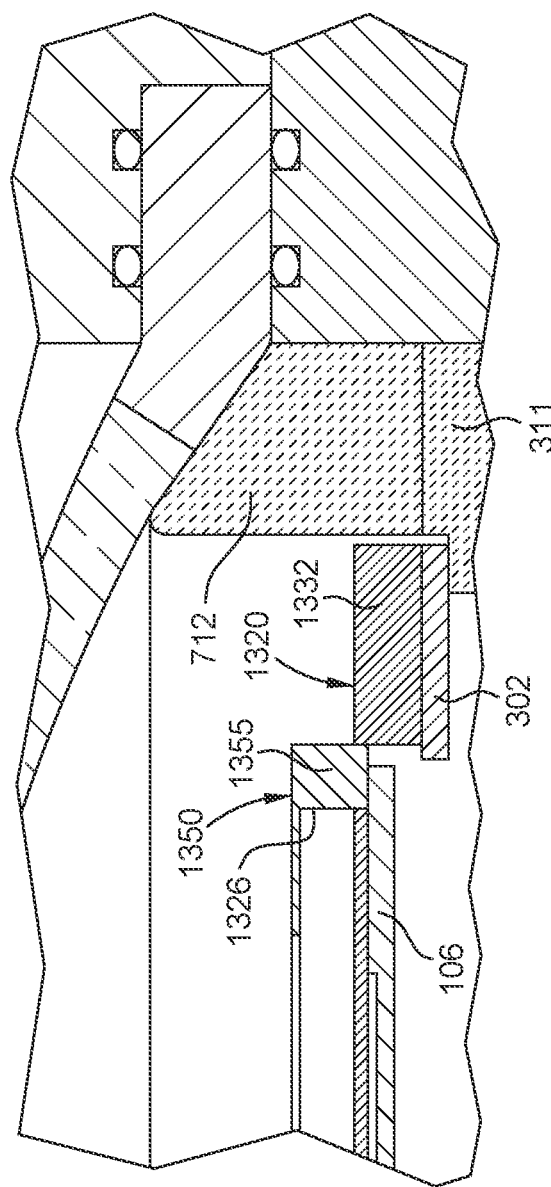
FIG. 16 is an enlarged cross-sectional view of the processing chamber shown in FIG. 15, according to one implementation.

FIG. 16 is an enlarged cross-sectional view of the processing chamber 1300 shown in FIG. 15, according to one implementation. The cross-sectional view of FIG. 16 is taken along a different radial angle than the cross-sectional view shown in FIG. 15.

In FIGS. 15 and 16 the substrate 102 has been removed from the processing chamber 1300, and the cover 1350 has been lifted into a raised position to open one or more gaps between the cover 1350 and the flow guide 1320. One or more cleaning gases C1 flow through the one or more gaps, through one or more first openings 1356 of the cover 1350, and into the upper portions 136b of the process volume 136. The cleaning gases C1 flow through one or more second openings 1357 of the cover 1350, through one or more gaps between the cover 1350 and the flow guide 1320, and are exhausted from the processing chamber 1300.

In the cleaning position in FIGS. 15 and 16, the substrate 102 has been removed from the internal volume of the processing chamber 300. Using lowering of the substrate support 106, the process kit 310 has been lowered such that the middle plate 321 is lowered to be at a gap from the upper liner 712. One or more cleaning gases C1 are supplied into the processing volume 136 through the gas inlets 114. At least part of the one or more cleaning gases C1 flow through the gap between the middle plate 321 and the upper liner 712, and into the upper portion 136b.

Figure 17:
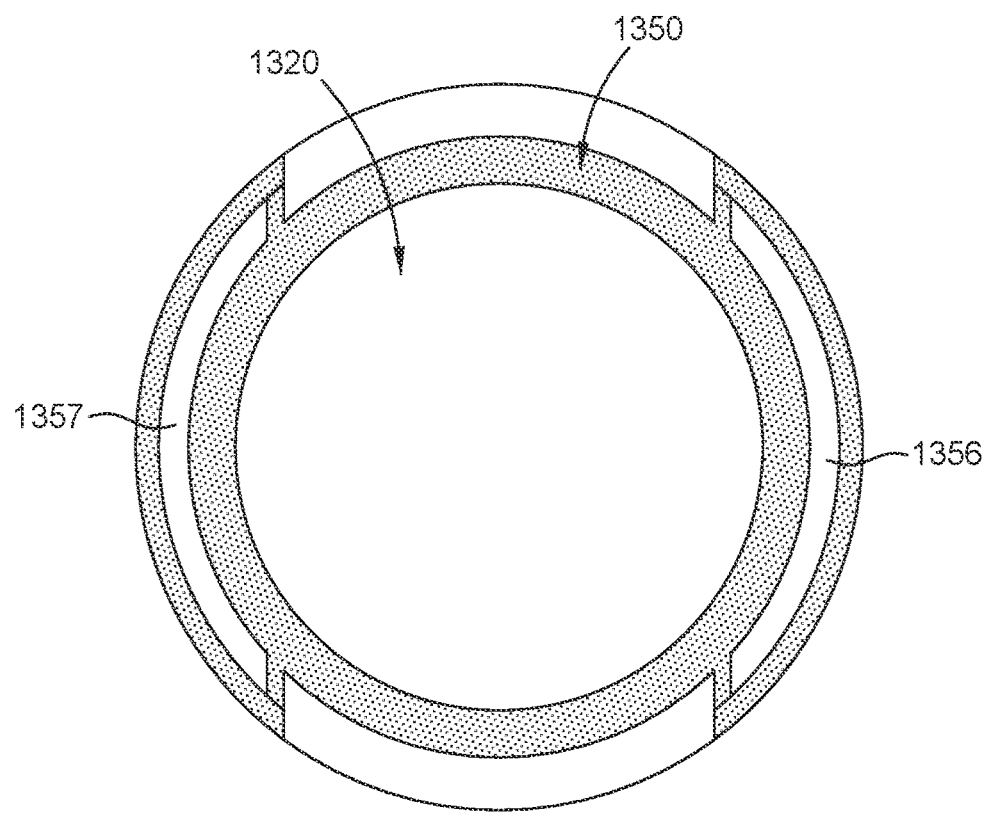
FIG. 17 is a schematic top view of the flow guide and the cover shown in FIG. 13, according to one implementation.

FIG. 17 is a schematic top view of the flow guide 1320 and the cover 1350 shown in FIG. 13, according to one implementation.

Figure 18:
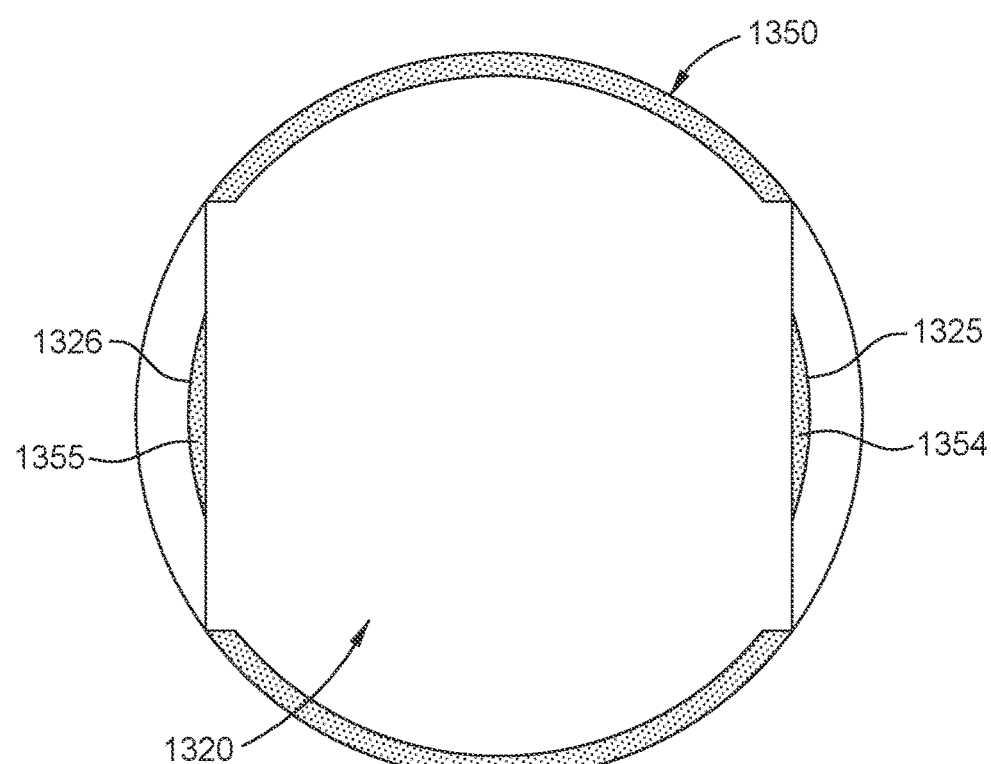
FIG. 18 is a schematic bottom view of the flow guide and the cover shown in FIG. 13, according to one implementation.

FIG. 18 is a schematic bottom view of the flow guide 1320 and the cover 1350 shown in FIG. 13, according to one implementation.

Figure 19:
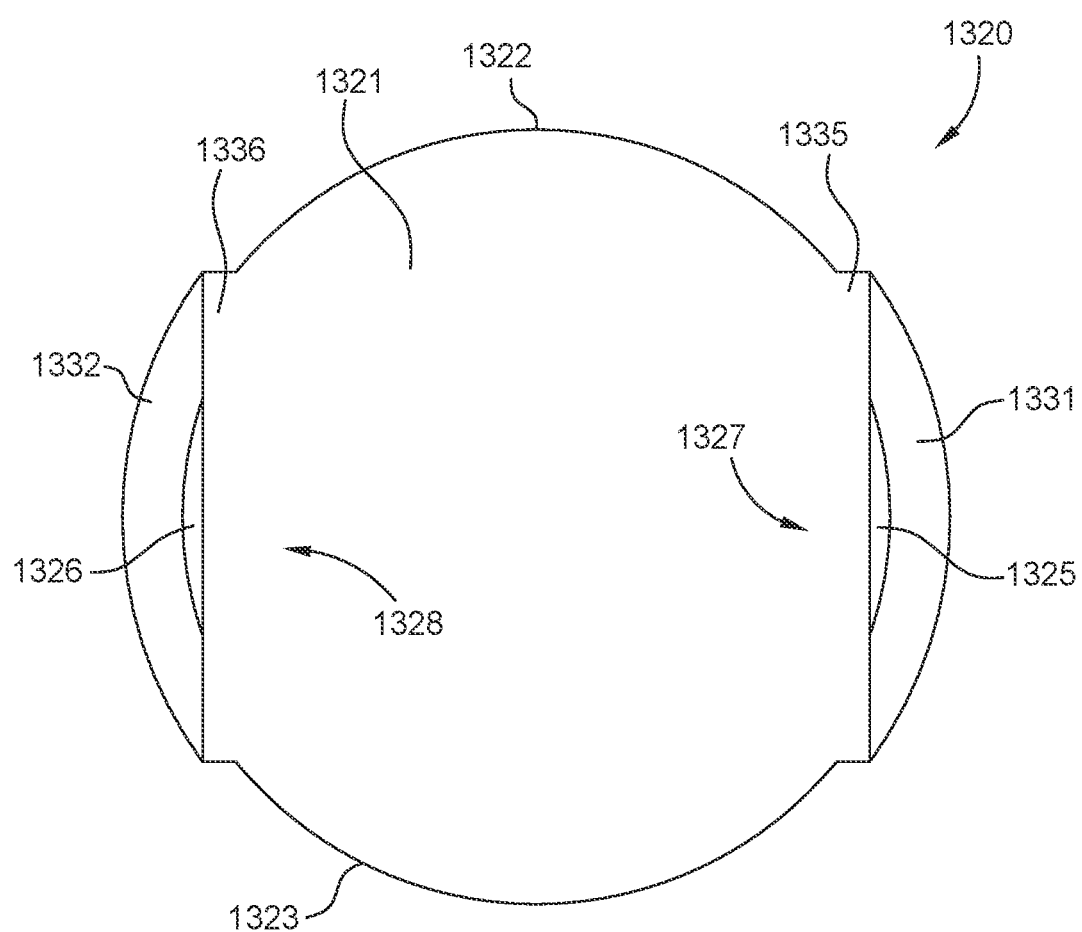
FIG. 19 is a schematic top view of the flow guide shown in FIG. 13, according to one implementation.

FIG. 19 is a schematic top view of the flow guide 1320 shown in FIG. 13, according to one implementation.

Figure 20:
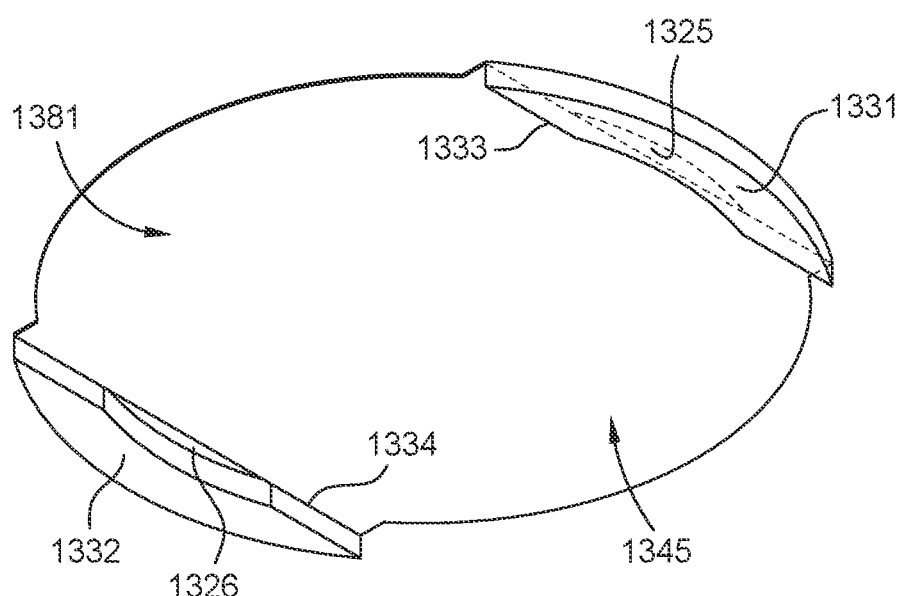
FIG. 20 is a schematic perspective view of a bottom of the flow guide shown in FIG. 13, according to one implementation.

FIG. 20 is a schematic perspective view of a bottom of the flow guide 1320 shown in FIG. 13, according to one implementation.

The flow guide 1320 includes a middle plate 1321 having a first side 1322 and a second side 1323 opposing the first side 1322 along a first direction. The first side 1322 and the second side 1323 are arcuate. The flow guide 1320 includes a first flange 1331 extending outwardly relative to a third side 1327 of the middle plate 1321 and outwardly relative to an outer face 1345 of the middle plate 1321, and a second flange 1332 extending outwardly relative to a fourth side 1328 of the middle plate 1321 and outwardly relative to the outer face 1345 of the middle plate 1321. The fourth side 1328 opposes the third side 1327 along a second direction that intersects the first direction. In one or more embodiments, the second direction is perpendicular to the first direction. A rectangular flow opening 1381 is defined between a first planar inner face 1333 of the first flange 1331 and a second planar inner face 1334 of the second flange 1332.

The flow guide 1320 includes a first edge section 1335 extending between the third side 1327 of the middle plate 1321 and the first flange 1331, and a second edge section 1336 extending between the fourth side 1328 of the middle plate 1321 and the second flange 1332. Each of the first edge section 1335 and the second edge section 1336 is rectangular in shape. The flow guide 1320 includes a first opening 1325 formed between the first flange 1331 and the first edge section 1335, and a second opening 1326 formed between the second flange 1332 and the second edge section 1336.

Figure 21:
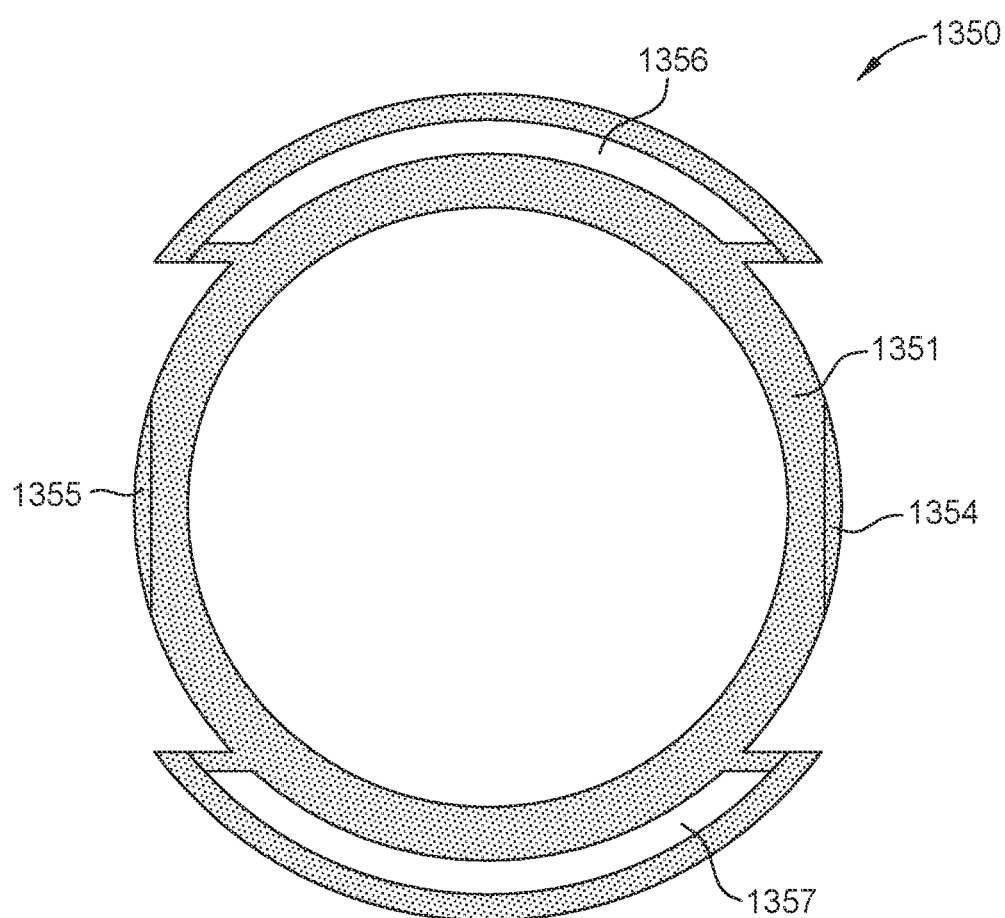
FIG. 21 is a schematic top view of the cover shown in FIG. 13, according to one implementation.

FIG. 21 is a schematic top view of the cover 1350 shown in FIG. 13, according to one implementation.

Figure 22:
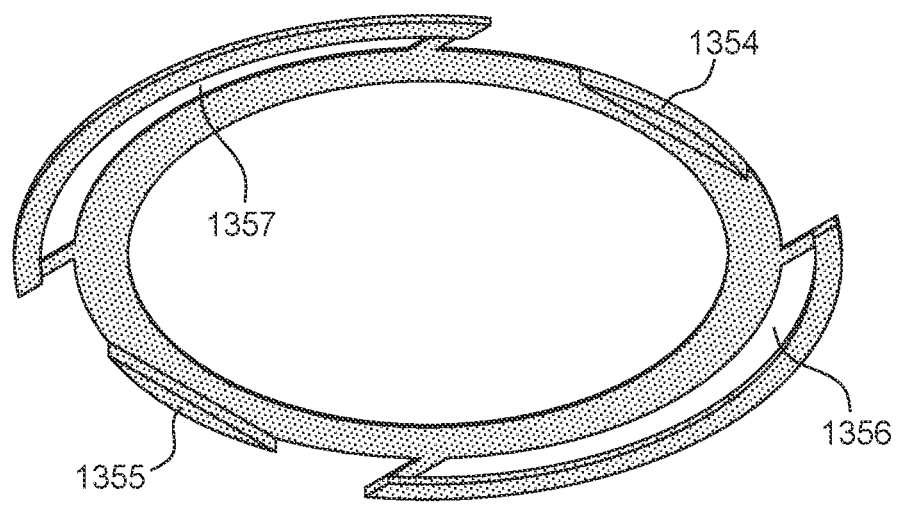
FIG. 22 is a schematic perspective view of a bottom of the cover shown in FIG. 13, according to one implementation.

FIG. 22 is a schematic perspective view of a bottom of the cover 1350 shown in FIG. 13, according to one implementation.

The cover 1350 includes a ring 1351, a first protrusion 1354 extending from the ring 1351 and configured to extend into the first opening 1325 of the flow guide 1320. The cover 1350 includes a second protrusion 1355 extending from the ring 1351 and configured to extend into the second opening 1326 of the flow guide 1320.

The first protrusion 1354 and the second protrusion 1355 are slidable respectively in the first opening 1325 and the second opening 1326 of the flow guide 1320. Each of the first opening 1325, the second opening 1326, the first protrusion 1354, and the second protrusion 1355 is semi-circular in shape.

Figure 23:
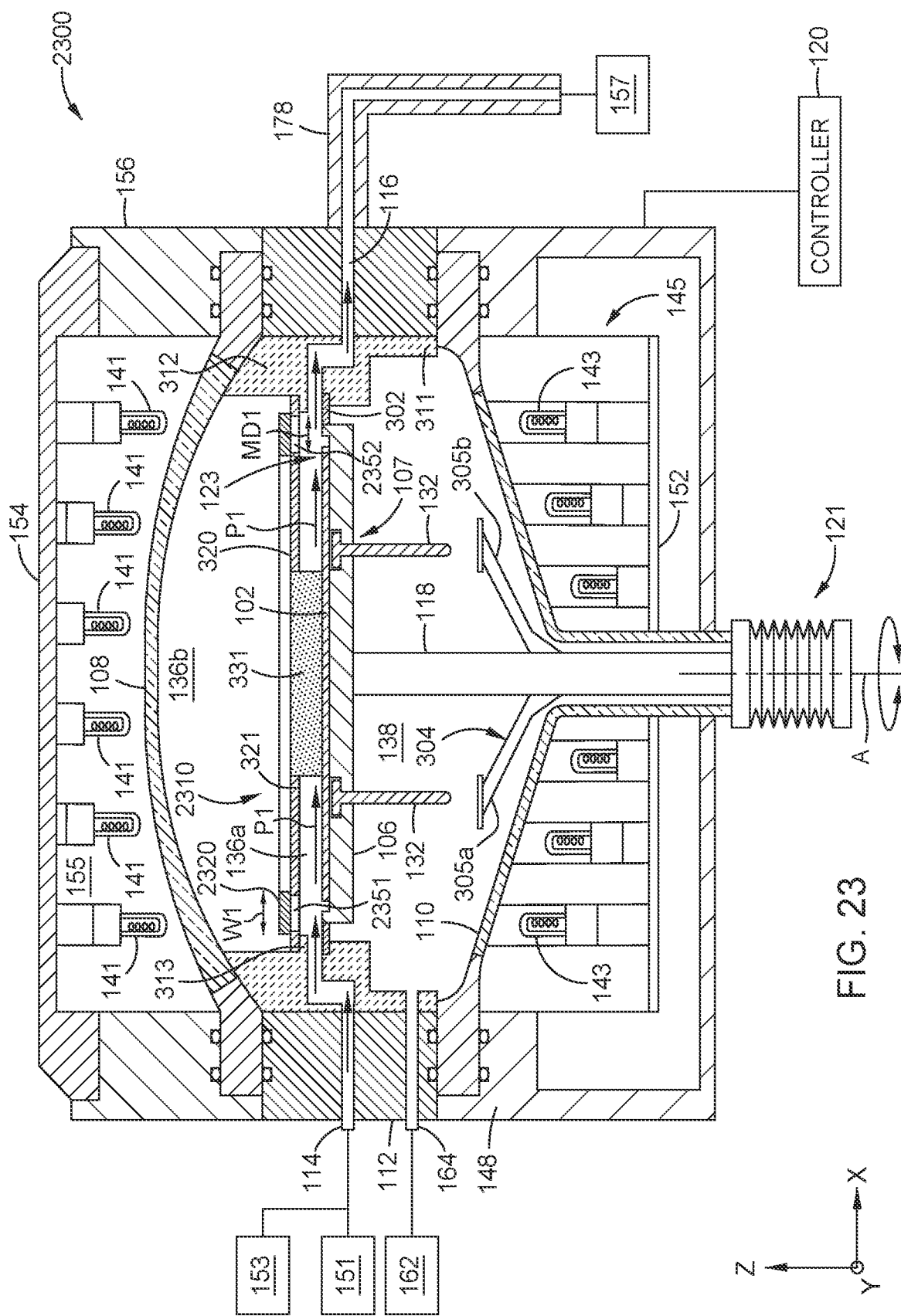
FIG. 23 is a partial schematic side cross-sectional view of a processing chamber with a process kit in a processing position, according to one implementation.

FIG. 23 is a partial schematic side cross-sectional view of a processing chamber 2300 with a process kit 2310 in a processing position, according to one implementation.

The processing chamber 2300 is similar to the processing chamber 300 shown in FIG. 3, and includes one or more of the aspects, features, components, properties, and/or operations thereof. The process kit 2310 is similar to the process kit 310 shown in FIG. 3, and includes one or more of the aspects, features, components, properties, and/or operations thereof.

In the implementation shown in FIG. 23, the flanges 331, 332 are movable upwardly and downwardly relative to the middle plate 321, and the middle plate 321 is supported on the ledge 313 of the upper liner 312. In the implementation shown in FIG. 23, one or more first openings 2351 are formed in the middle plate 321 adjacent to the first side 322, and one or more second openings 2352 are formed in the middle plate 321 adjacent to the second side 323.

The process kit 2310 includes a cover 2320 configured to cover the one or more first openings 2351 and the one or more second openings 2352 when the cover 2320 is in the processing position shown in FIG. 23. The cover 2320 includes a ring having a width W1 that is larger than a major diameter MD1 of each of the one or more first openings 2351 and the one or more second openings 2352.

The resting of the cover 2320 on the middle plate 321 in the processing position seals the openings 2351, 2352 to seal the upper portion 136b of the process volume 136 from the lower portion 136a.

The cover 2320 is supported on the protrusion section 335 of the first flange 331 and the protrusion section 336 of the second flange 332. Raising and lowering of the substrate support 306 raises and lowers the flanges 331, 332, which in turn raises and lowers the cover 2320 using the interface between the protrusion sections 335, 336 and the cover 2320.

Figure 24:
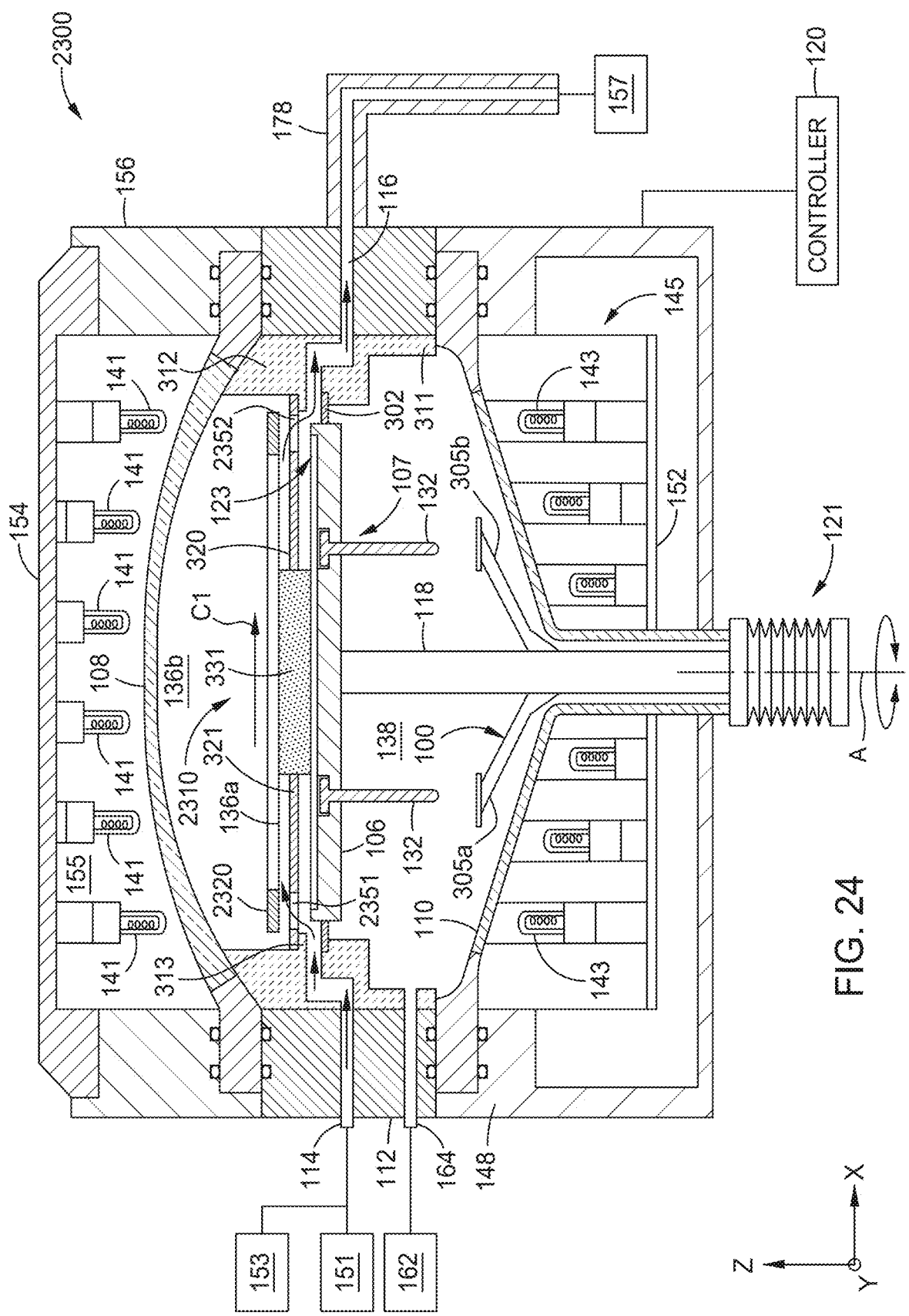
FIG. 24 is a partial schematic side cross-sectional view of the processing chamber with the process kit (shown in FIG. 23) in a cleaning position, according to one implementation.

FIG. 24 is a partial schematic side cross-sectional view of the processing chamber 2300 with the process kit 2310 (shown in FIG. 23) in a cleaning position, according to one implementation.

In FIG. 24, the cleaning position is a raised position relative to the processing position shown in FIG. 23.

In FIG. 24 the substrate has been removed from the processing chamber 1300, and the cover 2320 has been lifted into a raised position to open the openings 2351, 2352 of the middle plate 321. One or more cleaning gases C1 flow through the one or more first openings 2351 and into the upper portion 136b of the process volume 136. The cleaning gases C1 flow through the one or more second openings 2352, and the flow guide 1320, and are exhausted from the processing chamber 2300.

Figure 25:
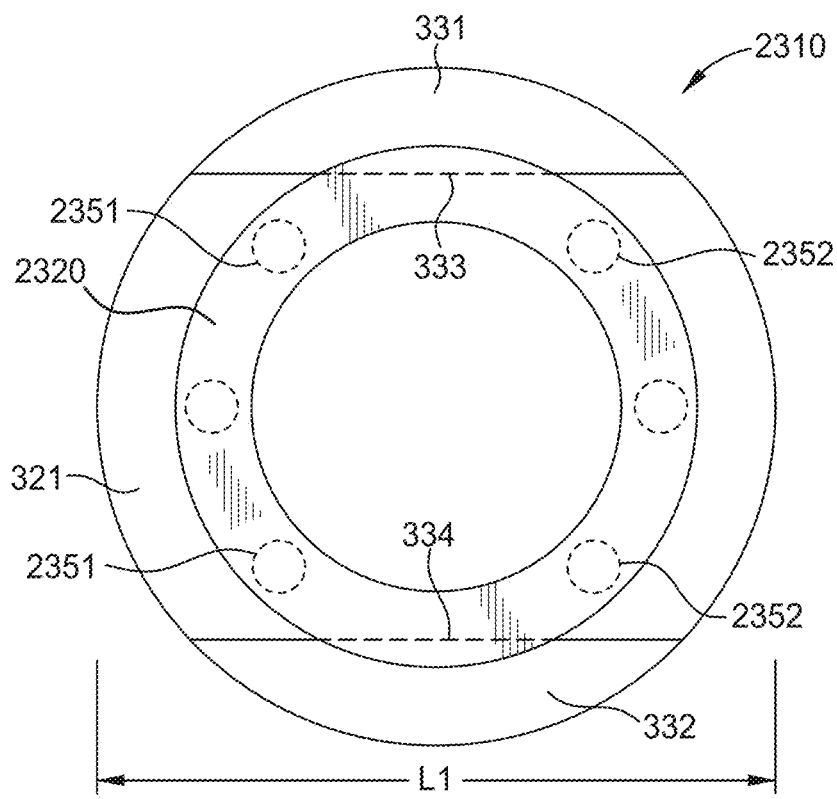
FIG. 25 is schematic top view of the process kit shown in FIGS. 23 and 24, according to one implementation.

FIG. 25 is schematic top view of the process kit 2310 shown in FIGS. 23 and 24, according to one implementation. An inner face (e.g., a bottom face) of the middle plate 321 (which faces the substrate support 106 and the substrate 102) can be planar, as shown in FIG. 3.

Figure 26:
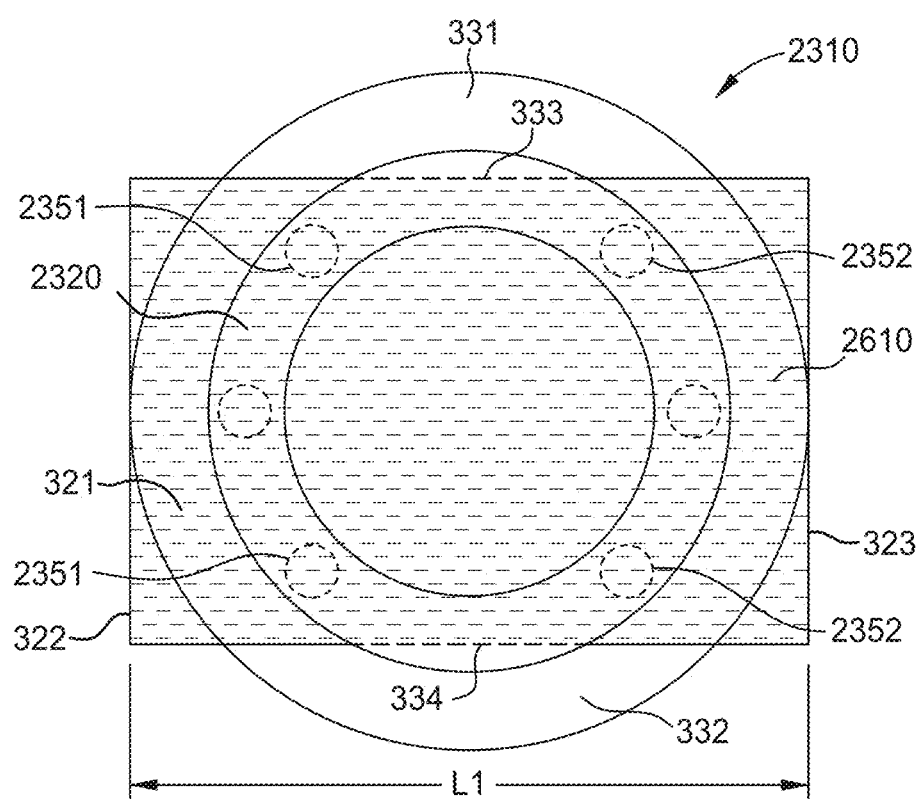
FIG. 26 is schematic top view of the process kit shown in FIGS. 23 and 24, according to one implementation.

FIG. 26 is schematic top view of the process kit 2310 shown in FIGS. 23 and 24, according to one implementation. In the implementation shown in FIG. 26, the inner face of the middle plate 321 includes a plurality of fins 2610 extending along a length L1 of the middle plate 321. The length L1 extends between the first side 322 and the second side 323. In the implementation shown in FIG. 25, the length L1 corresponds to a diameter of the middle plate 321 between. In the implementation shown in FIG. 26, the first side 322 and the second side 323 of the middle plate 321 are linear (rather than arcuate) such that the length L1 is the length of a rectangular shape.

Figure 27:
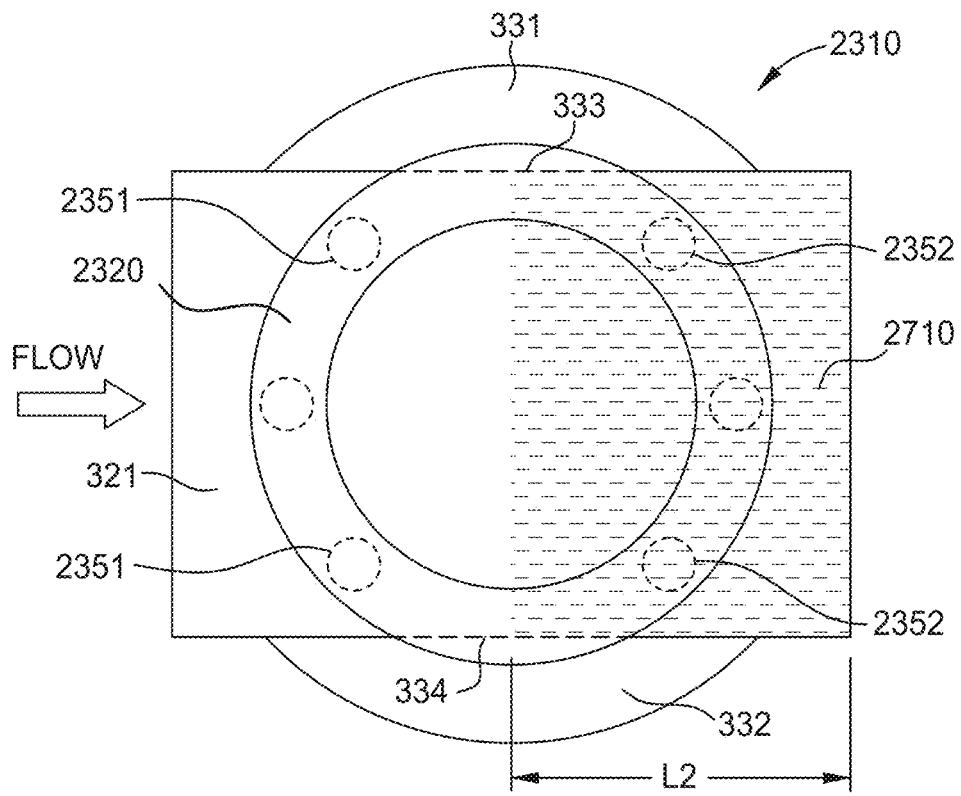
FIG. 27 is schematic top view of the process kit shown in FIGS. 23 and 24, according to one implementation.

FIG. 27 is schematic top view of the process kit 2310 shown in FIGS. 23 and 24, according to one implementation. In the implementation shown in FIG. 27, the inner face of the middle plate 321 includes a plurality of fins 2710. Each of the fins 271 has a length L2 that is lesser than the length L1 of the middle plate 321. In the implementation shown in FIG. 27, the length L2 is about 50% of the length L1.

Figure 28:
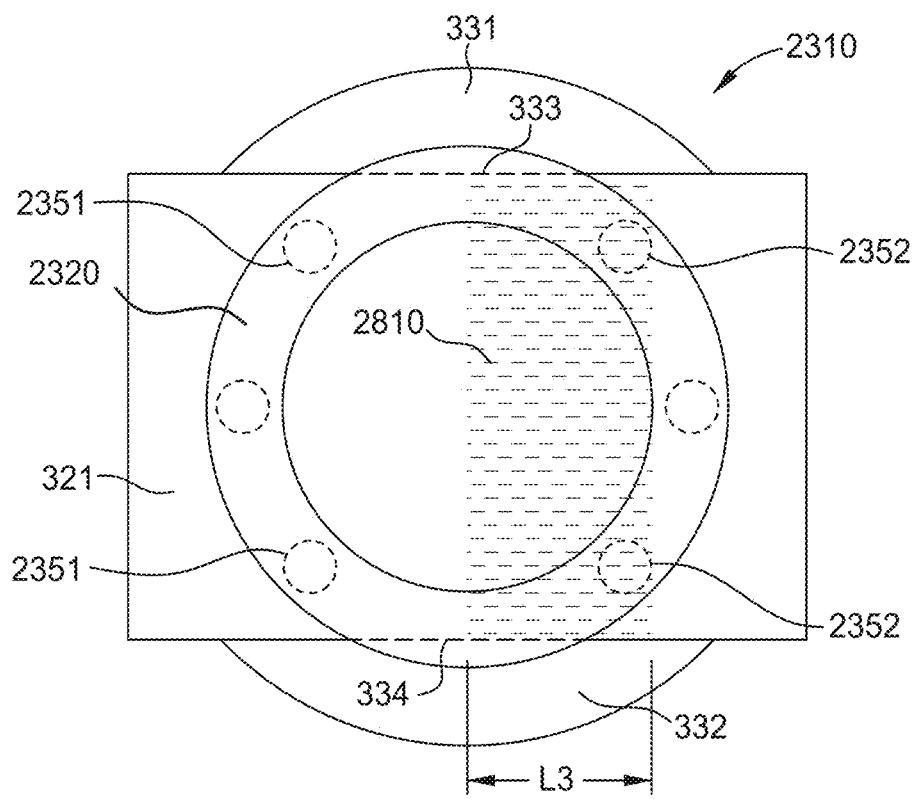
FIG. 28 is schematic top view of the process kit shown in FIGS. 23 and 24, according to one implementation.

FIG. 28 is schematic top view of the process kit 2310 shown in FIGS. 23 and 24, according to one implementation. In the implementation shown in FIG. 28, the inner face of the middle plate 321 includes a plurality of fins 2810. Each of the fins 271 has a length L2 that is lesser than the length L1 of the middle plate 321. In the implementation shown in FIG. 28, the length L2 is about 30% of the length L1.

Figure 29:
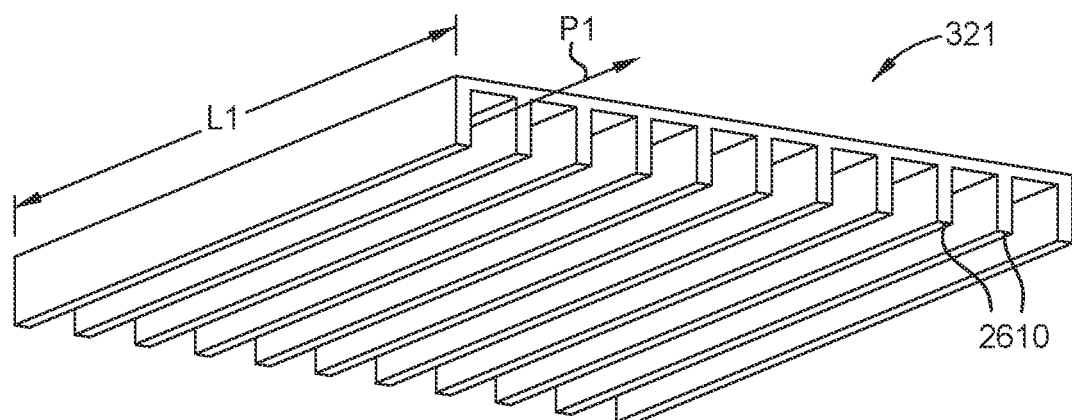
FIG. 29 is a schematic perspective view of the inner face of the middle plate shown in FIG. 26, according to one implementation.

FIG. 29 is a schematic perspective view of the inner face of the middle plate 321 shown in FIG. 26, according to one implementation. As shown in FIG. 29, the one or more process gases P1 flow through flow paths between the fins 2610.

Figure 30:
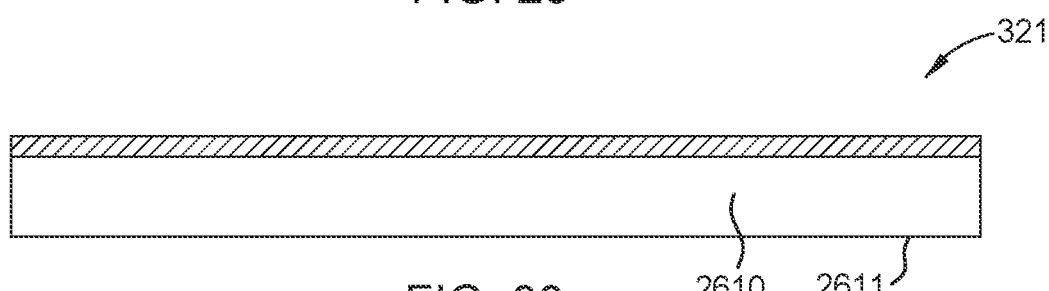
FIG. 30 is a schematic cross-sectional side view of the middle plate shown in FIG. 29, according to one implementation.

FIG. 30 is a schematic cross-sectional side view of the middle plate 321 shown in FIG. 29, according to one implementation. As shown in FIGS. 29 and 30, the fins 2610 have a planar edge 2611.

Figure 31:
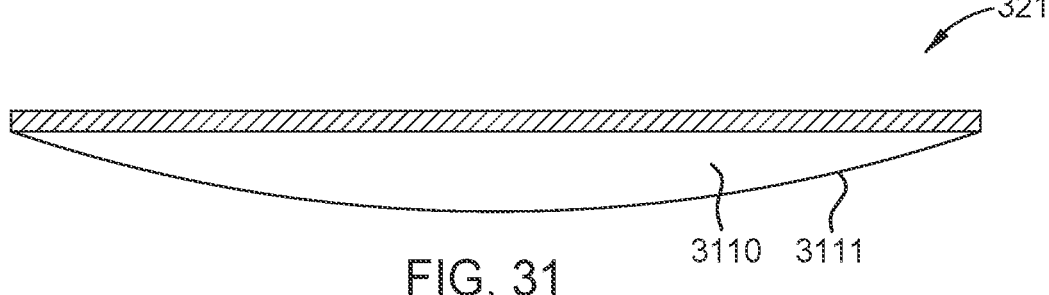
FIG. 31 is a schematic cross-sectional side view of the middle plate shown in FIG. 29, according to one implementation.

FIG. 31 is a schematic cross-sectional side view of the middle plate 321 shown in FIG. 29, according to one implementation. As shown in FIG. 31, fins 3110 have an arcuate edge 3111.

Figure 32:
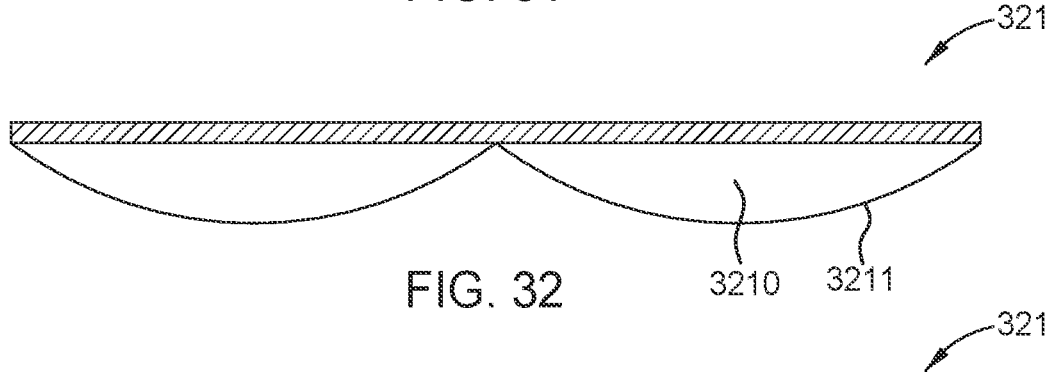
FIG. 32 is a schematic cross-sectional side view of the middle plate shown in FIG. 29, according to one implementation.

FIG. 32 is a schematic cross-sectional side view of the middle plate 321 shown in FIG. 29, according to one implementation. As shown in FIG. 32, fins 3210 have a patterned edge 3211 such that multiple arcs are included along the length L1 for each fin 3210.

Figure 33:
FIG. 33 is a schematic side view of the middle plate shown in FIG. 26, according to one implementation.

FIG. 33 is a schematic side view of the middle plate 321 shown in FIG. 26, according to one implementation. In the implementation shown in FIG. 33, the fins 2610 are omitted and the middle plate 321 includes a pair of support legs 3310, 3311. The support legs 3310, 3311 can be supported on one or more of the flanges 331, 332, the substrate support 106, the upper liner 312, and/or the pre-heat ring 302.

Figure 34:
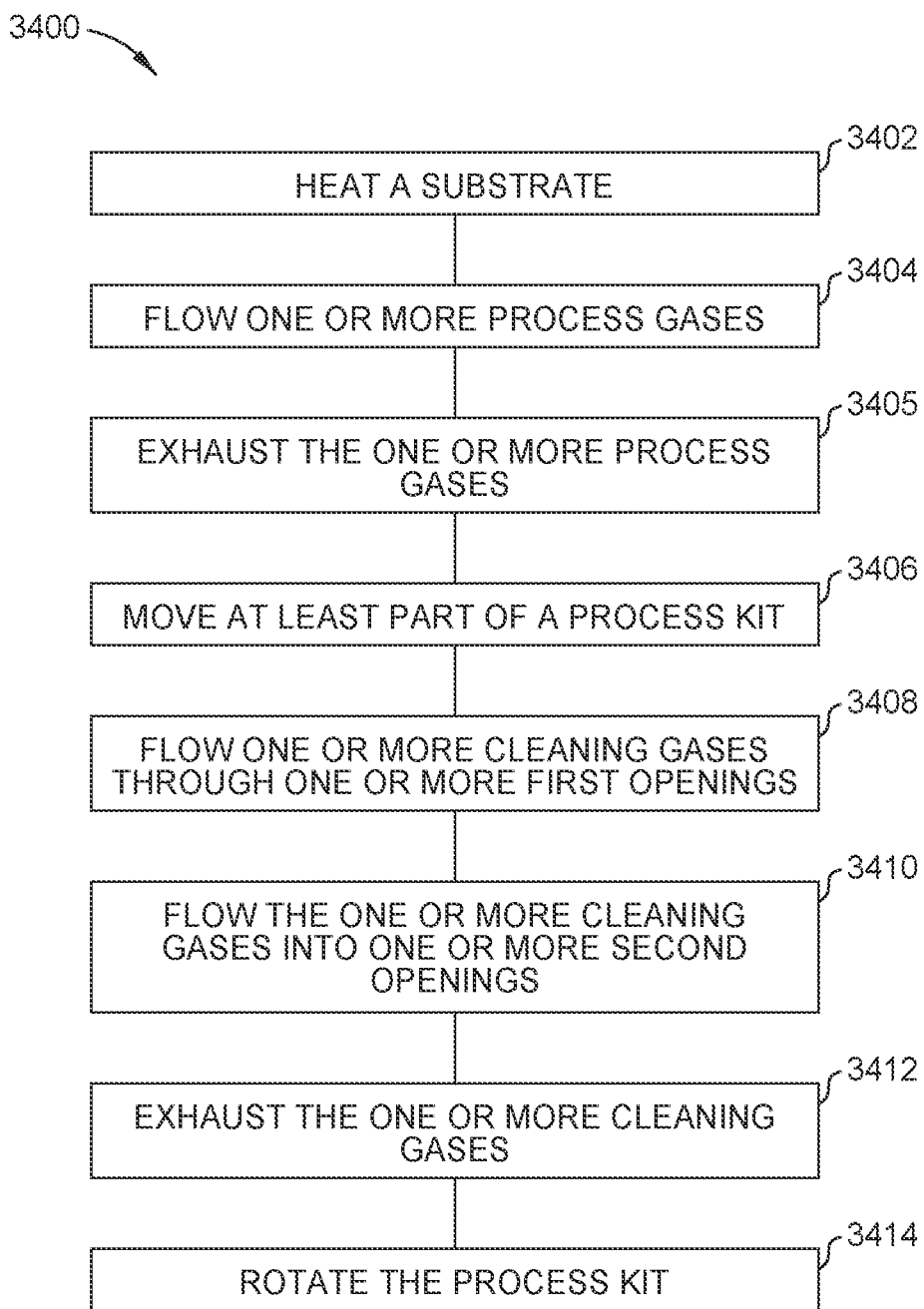
FIG. 34 is a schematic block diagram view of a method of processing substrates, according to one implementation.

FIG. 34 is a schematic block diagram view of a method 3400 of processing substrates, according to one implementation.

Operation 3402 includes heating a substrate positioned on a substrate support.

Operation 3404 includes flowing one or more process gases over the substrate to form one or more layers on the substrate. The flowing of the one or more process gases over the substrate includes guiding the one or more process gases through a rectangular flow opening of a process kit. In one embodiment, which can be combined with other embodiments, the one or more process gases are supplied at a pressure that is 300 Torr or greater, such as within a range of 300 Torr to 600 Torr. In one embodiment, which can be combined with other embodiments, the one or more process gases are supplied at a flow rate that is less than 5,000 standard cubic centimeters per minute (SCCM). In one embodiment, which can be combined with other embodiments, the substrate is rotated at a rotation speed that is less than 8 rotations-per-minute (RPM) during the flowing of the one or more process gases over the substrate. In one example, which can be combined with other examples, the rotation speed is 1 RPM.

Operation 3405 includes exhausting the one or more process gases through an exhaust path formed at least partially in a sidewall.

Operation 3406 includes, after the exhausting of the one or more process gases, moving at least part of the process kit to open one or more first openings and one or more second openings. At least the part of the process kit is moved by a distance that is less than 20 mm, such as 10 mm. In one or more embodiments, the moving includes lifting or lowering at least the part of the process kit. In one embodiment, which can be combined with other embodiments, the moving of at least the part of the process kit includes lifting a cover to slide one or more protrusions of the cover relative to a middle plate of a flow guide while the middle plate is supported on a pre-heat ring. In one embodiment, which can be combined with other embodiments, the moving of at least the part of the process kit includes lifting a cover. The cover includes a ring having a width that is larger than a major diameter of each of the one or more first openings and the one or more second openings. In one embodiment, which can be combined with other embodiments, the moving of at least the part of the process kit includes lifting or lowering a middle plate of a flow guide by moving two flanges coupled to the middle plate using the substrate support.

Operation 3408 includes flowing one or more cleaning gases through the one or more first openings and into a region between the process kit and a window.

Operation 3410 includes flowing the one or more cleaning gases through the region and into the one or more second openings.

Operation 3412 includes, after the flowing of the one or more cleaning gases into the one or more second openings, exhausting the one or more cleaning gases through the exhaust path.

Operation 3414 includes rotating the process kit by a rotation angle that is greater than 0 degrees and less than 90 degrees. The process kit can be rotated, for example, while the process kit is in a cleaning position that is used for operations 3408, 3410. In one embodiment, which can be combined with other embodiments, the rotation angle is within a range of 15 degrees to 30 degrees.

The method 3400 can also include flowing one or more purge gases into the processing chamber. The one or more purge gases can flow into the processing chamber before, during, and/or after one or more of operation 3404, operation 3405, operation 3408, operation 3410, and/or operation 3412. The one or more purge gases can flow into a slit valve of the processing chamber, the lower portion 136a of the processing volume, the upper portion 136b of the processing volume 136, any other portion(s) of the processing volume 136, and/or the purge volume 138.

Figure 35:
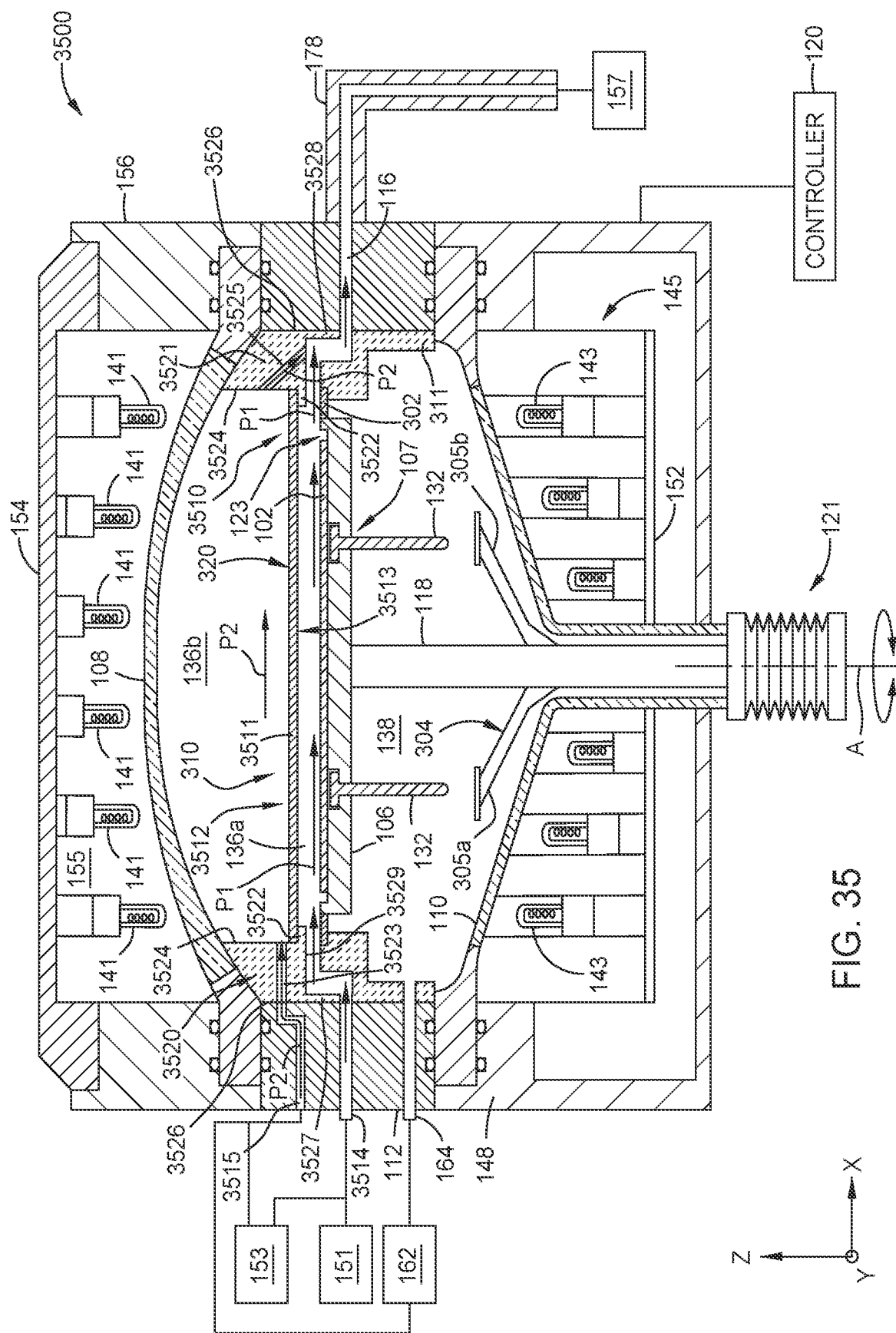
FIG. 35 is a partial schematic side cross-sectional view of a processing chamber with a process kit, according to one implementation.

FIG. 35 is a partial schematic side cross-sectional view of a processing chamber 3500 with a process kit 3510, according to one implementation. The processing chamber 3500 is similar to the processing chamber 300 shown in FIG. 3, and includes one or more of the aspects, features, components, properties, and/or operations thereof. The processing chamber 3500 is shown in a processing condition in FIG. 35.

The process kit 3510 includes a plate 3511 having a first face 3512 and a second face 3513 opposing the first face 3512. The second face 3513 faces the substrate support 106. The process kit 3510 includes a liner 3520. The liner 3520 includes an annular section 3521, and one or more ledges 3522 extending inwardly relative to the annular section 3521. The one or more ledges 3522 are configured to support one or more outer regions of the second face 3513 of the plate 3511. The liner 3520 includes one or more inlet openings 3523 extending to an inner surface 3524 of the annular section 3521 on a first side of the liner 3520, and one or more outlet openings 3525 extending to the inner surface 3524 of the annular section 3521 on a second side of the liner 3520.

The one or more inlet openings 3523 extend from an outer surface 3526 of the annular section 3521 of the liner 3520 to the inner surface 3524. The one or more outlet openings 3525 extend from a lower surface 3529 of the liner 3520 to the inner surface 3524. The liner 3520 includes a first extension 3527 and a second extension 3528 disposed outwardly of the lower surface 3529 of the liner 3520. At least part of the annular section 3521 of the liner 3520 is aligned with the first extension 3527 and the second extension 3528. In the implementation shown in FIG. 35, a lowermost end of the plate 3511 is aligned above a lowermost end of the liner 3520. In the implementation shown in FIG. 35, the lowermost end of the plate 3511 is part of the second face 3513, and the lowermost end of the liner 3520 is part of the first extension 3527 and/or the second extension 3528. The present disclosure contemplates that the lowermost end of the liner 3520 can be part of the lower surface 3529.

The plate 3511 is in the shape of a disc, and the annular section 3521 is in the shape of a ring. The plate 3511 can be in the shape of a rectangle. In one or more embodiments, the one or more ledges 3522 include a single ledge in the shape of a ring. In one or more embodiments, the one or more ledges 3522 include two ledges that oppose each other and are in the shape of arcuate segments.

The flow module 112 (which can be at least part of a sidewall of the processing chamber 3500) includes one or more first inlet openings 3514 in fluid communication with the lower portion 136a of the processing volume 136. The flow module 112 includes one or more second inlet openings 3515 in fluid communication with the upper portion 136b of the processing volume 136. The one or more first inlet openings 3514 are in fluid communication with one or more flow gaps between the liner 3520 (an upper liner in FIG. 35) and the lower liner 311. The one or more second inlet openings 3515 are in fluid communication with the one or more inlet openings 3523 of the liner 3520.

Figure 37:
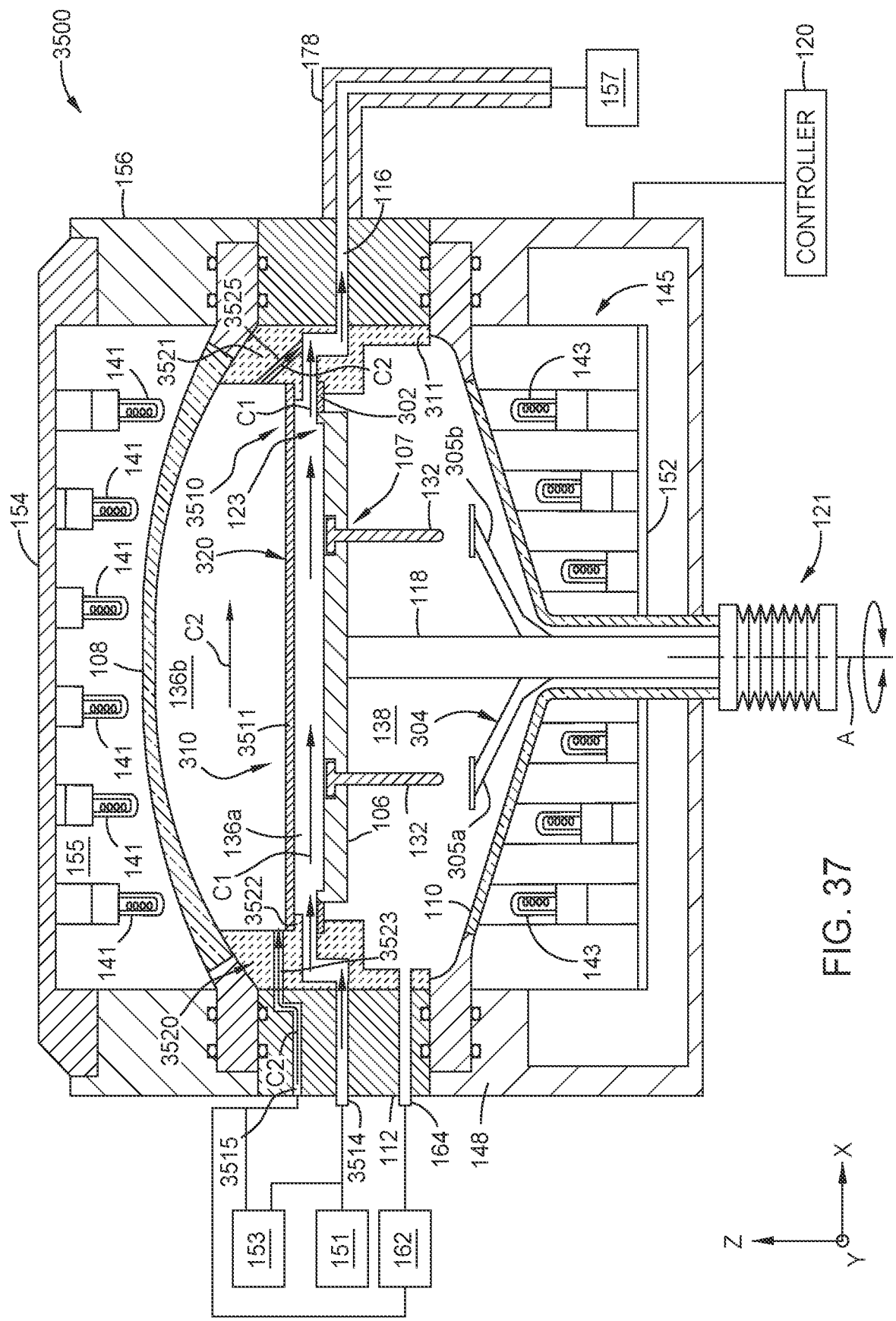
FIG. 37 is a partial schematic side cross-sectional view of the processing chamber shown in FIG. 35, according to one implementation.

In the implementations shown in FIGS. 35 and 37, the one or more inlet openings 3523 are oriented in a horizontal orientation and the one or more outlet openings 3525 are oriented in an angled orientation. The present disclosure contemplates that the one or more inlet and/or outlet openings 3523, 3525 can be oriented in a horizontal orientation, oriented in an angled orientation, and/or can include one or more turns (such as the turns shown for the one or more first inlet openings 3514 and the one or more gas exhaust outlets 116).

During a deposition operation (e.g., an epitaxial growth operation), the one or more process gases P1 flow through the one or more first inlet openings 3514, through the one or more gaps, and into the lower portion 136a of the processing volume 136 to flow over the substrate 102. During the deposition operation, one or more purge gases P2 flow through the one or more second inlet openings 3515, through the one or more inlet openings 3523 of the liner 3520, and into the upper portion 136b of the processing volume 136. The one or more purge gases P2 flow simultaneously with the flowing of the one or more process gases P1. The flowing of the one or more purge gases P2 through the upper portion 136b facilitates reducing or preventing flow of the one or more process gases P1 into the upper portion 136b that would contaminate the upper portion 136b. The one or more process gases P1 are exhausted through gaps between the liner 3520 and the lower liner 311, and through the one or more gas exhaust outlets 116. The one or more purge gases P2 are exhausted through the one or more outlet openings 3525, through the same gaps between the liner 3520 and the lower liner 311, and through the same one or more gas exhaust outlets 116 as the one or more process gases P1. The present disclosure contemplates that that one or more purge gases P2 can be separately exhausted through one or more second gas exhaust outlets that are separate from the one or more gas exhaust outlets 116.

The present disclosure also contemplates that one or more purge gases can be supplied to the purge volume 138 (through the plurality of purge gas inlets 164) during the deposition operation, and exhausted from the purge volume 138.

Figure 36:
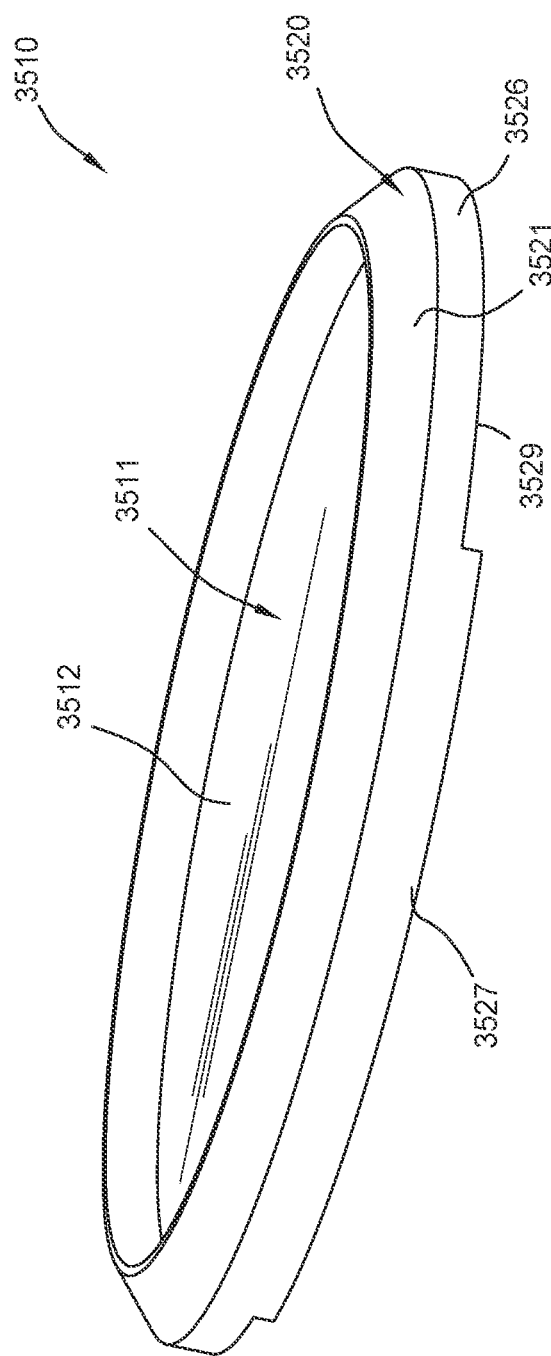
FIG. 36 is a schematic perspective view of the process kit shown in FIG. 35, according to one implementation.

FIG. 36 is a schematic perspective view of the process kit 3510 shown in FIG. 35, according to one implementation.

FIG. 37 is a partial schematic side cross-sectional view of the processing chamber 3500 shown in FIG. 35, according to one implementation. The processing chamber 3500 is shown in a cleaning condition in FIG. 37.

During a cleaning operation, one or more cleaning gases C1 flow through the one or more first inlet openings 3514, through the one or more gaps (between the liner 3520 and the lower liner 311), and into the lower portion 136a of the processing volume 136. During the cleaning operation, one or more cleaning gases C2 flow through the one or more second inlet openings 3515, through the one or more inlet openings 3523 of the liner 3520, and into the upper portion 136b of the processing volume 136. The one or more cleaning gases C2 flow simultaneously with the flowing of the one or more cleaning gases C1. The present disclosure contemplates that the one or more cleaning gases C2 used to clean surfaces adjacent the upper portion 136b can be the same as or different than the one or more cleaning gases C1 used to clean surfaces adjacent the lower portion 136a of the processing volume 136.

The processing chamber 3500 facilitates separating the gases provided to the lower portion 136a from the gases provided to the upper portion 136b, which facilitates parameter adjustability. Additionally, one or more purge gases and one or more cleaning gases can be separately provided to the upper portion 136b to facilitate reduced contamination of the window 108 and/or the plate 3511.

Figure 38:
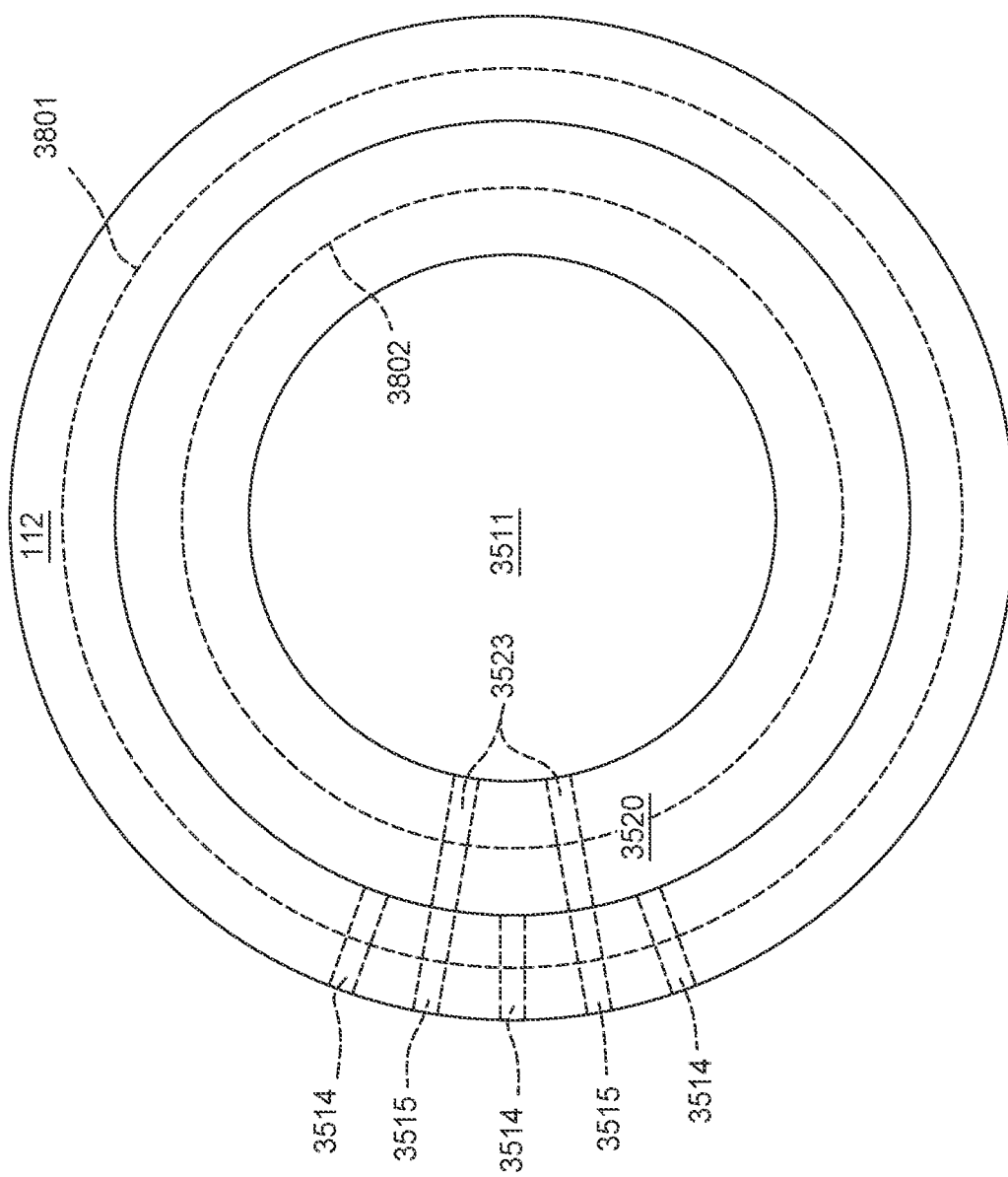
FIG. 38 is a schematic partial top view of the plate, the flow module, and the liner shown in FIGS. 35 and 37, according to one implementation.

As shown in FIGS. 35 and 37, the one or more second inlet openings 3515 can be aligned above the one or more first inlet openings 3514, and the one or more inlet openings 3523 of the liner 3520 can be aligned above the one or more gaps between the liner 3520 and the lower liner 311. As shown in FIG. 38, the one or more second inlet openings 3515 can be angularly offset from the one or more first inlet openings 3514, and the one or more inlet openings 3523 of the liner 3520 can be angularly offset from the one or more gaps between the liner 3520 and the lower liner 311.

The flow of gases in the lower portion 136a and the upper portion 136b during both the deposition operation and the cleaning operation facilitates reduced or eliminated backflow of gases at the one or more outlet openings 3525 (e.g., backflow from the one or more outlet openings 3525 into the upper portion 136b) and the one or more gas exhaust outlets 116 (e.g., backflow from the gaps into the lower portion 136a).

FIG. 38 is a schematic partial top view of the plate 3511, the flow module 112, and the liner 3520 shown in FIGS. 35 and 37, according to one implementation. In the implementation shown in FIG. 38, the one or more second inlet openings 3515 are angularly offset from the one or more first inlet openings 3514 along a circumference of the processing chamber 3500 (e.g., a circumference 3801 of the flow module 112).

The one or more inlet openings 3523 of the liner 3520 can be angularly offset from the one or more gaps between the liner 3520 and the lower liner 311 along a circumference of the chamber (e.g., a circumference 3802 of the liner 3520).

Figure 39:
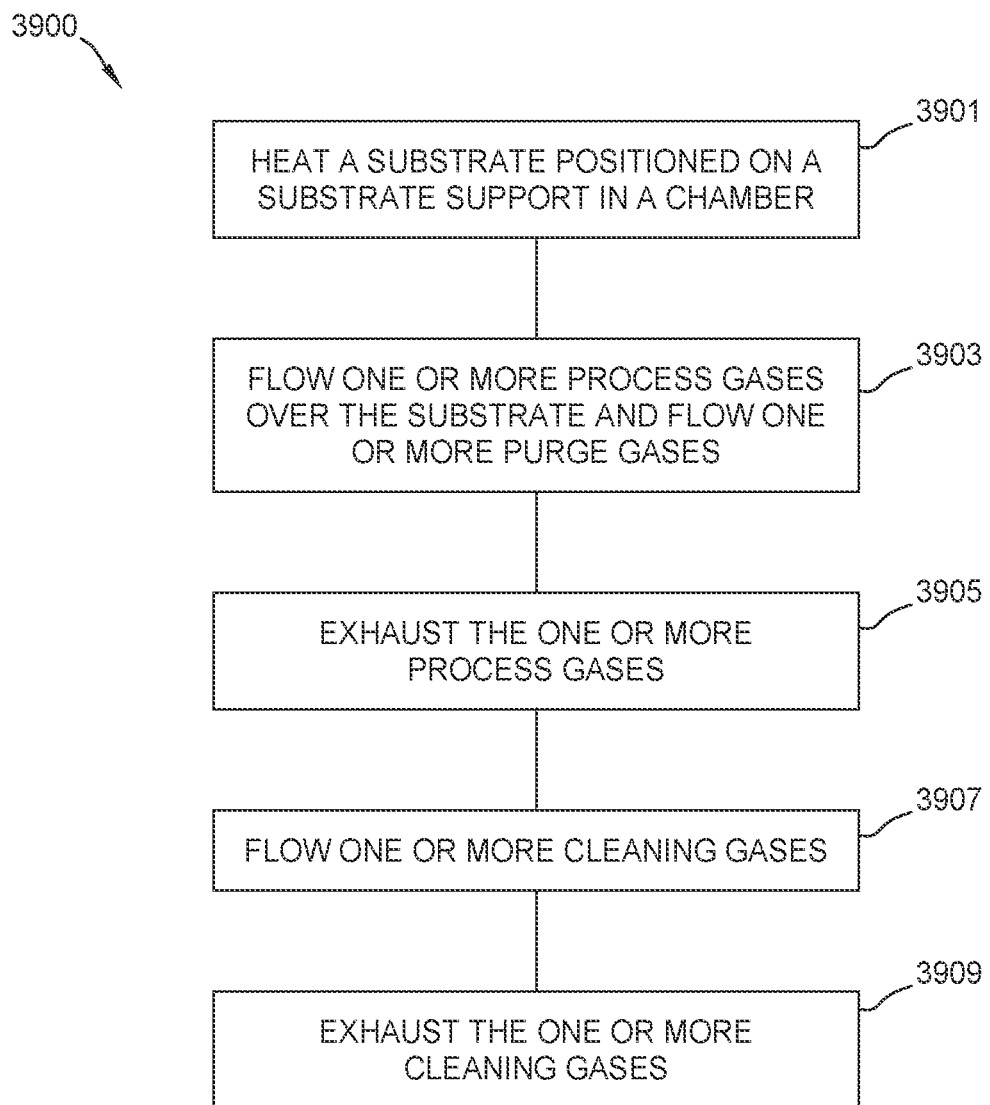
FIG. 39 is a schematic block diagram view of a method of processing substrates, according to one implementation.

FIG. 39 is a schematic block diagram view of a method 3900 of processing substrates, according to one implementation.

Operation 3901 of the method 3900 includes heating a substrate positioned on a substrate support in a chamber.

Operation 3903 includes flowing one or more process gases over the substrate to form one or more layers on the substrate. The one or more process gases flow through one or more first inlet openings in fluid communication with the lower portion of the processing volume. The flowing of the one or more process gases over the substrate includes guiding the one or more process gases between a plate and the substrate. The plate is supported on a liner to divide the processing volume into a lower portion and an upper portion. Operation 3903 includes flowing one or more purge gases through the upper portion simultaneously with the flowing of the one or more process gases over the substrate. The one or more purge gases flow through one or more second inlet openings in fluid communication with the upper portion of the processing volume.

Operation 3905 includes exhausting the one or more process gases.

Operation 3907 includes flowing one or more cleaning gases through the upper portion while the plate is supported on the liner, the upper portion being between the plate and a window. Operation 3907 includes flowing one or more cleaning gases through the lower portion of the processing volume simultaneously with the flowing of the one or more cleaning gases through the upper portion.

Operation 3909 includes exhausting the one or more cleaning gases from the upper portion and the lower portion of the processing volume.

Figure 40:
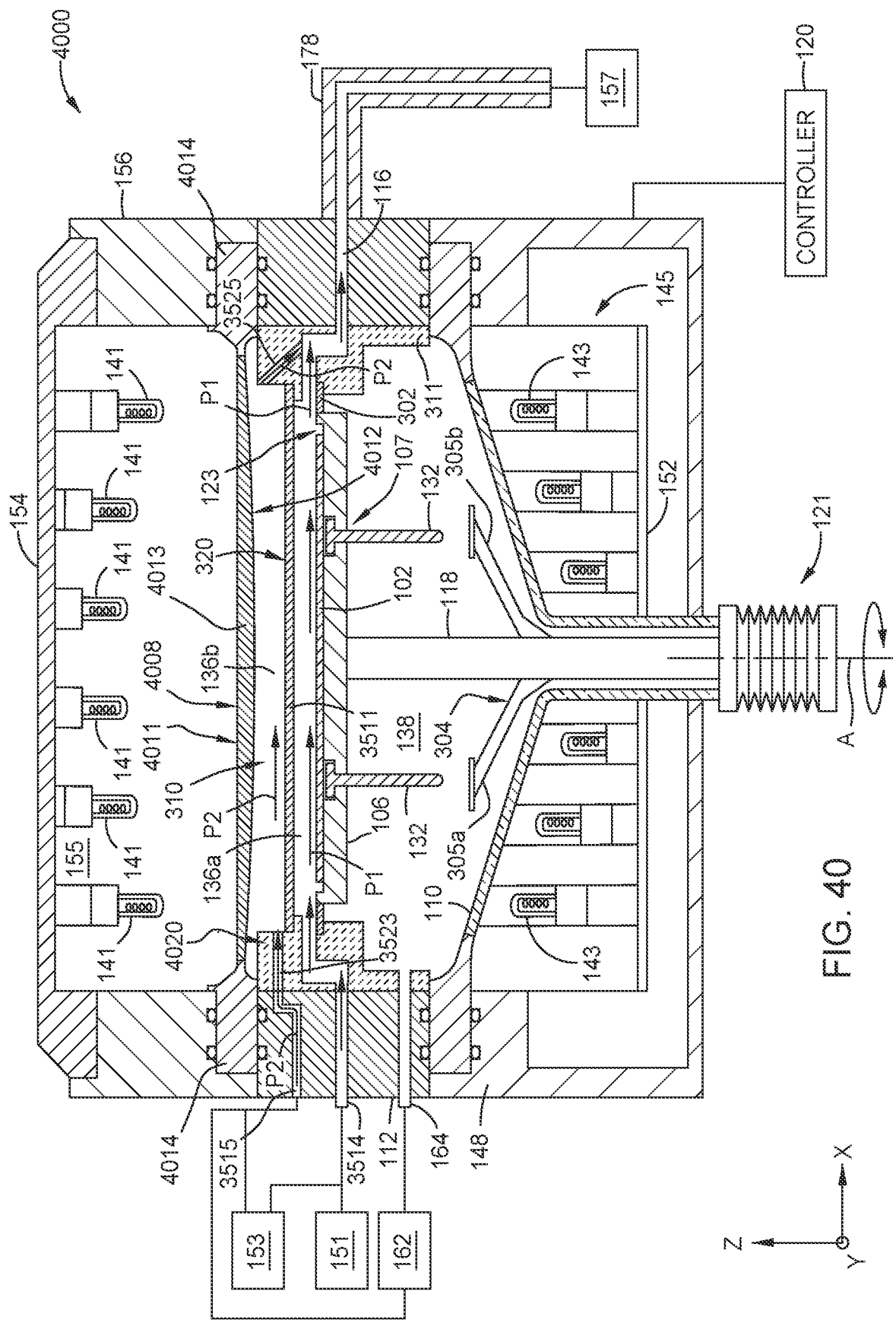
FIG. 40 is a partial schematic side cross-sectional view of a processing chamber, according to one implementation.

FIG. 40 is a partial schematic side cross-sectional view of a processing chamber 4000, according to one implementation. The processing chamber 4000 is similar to the processing chamber 3500 shown in FIGS. 35 and 37, and includes one or more of the aspects, features, components, properties, and/or operations thereof. The processing chamber 4000 is shown in a processing condition in FIG. 40.

The processing chamber 4000 includes a window 4008 that at least partially defines the processing volume 136. The window 4008 includes a first face 4011 that is concave or flat (in the implementation shown in FIG. 40, the first face 4011 is flat). The window 4008 includes a second face 4012 that is convex. The second face 4012 faces the substrate support 106.

A process kit in the processing chamber 4000 includes a liner 4020. The liner 4020 is similar to the liner 3520 shown in FIGS. 35 and 37, and includes one or more of the aspects, features, components, properties, and/or operations thereof.

The window 4008 includes an inner section 4013 and an outer section 4014. The first face 4011 and the second face 4012 are at least part of the inner section 4013. The inner section 4013 is transparent and the outer section 4014 is opaque. The outer section 4014 is received at least partially in one or more sidewalls (such as in the flow module 112) of the processing chamber 4000.

Figure 41:
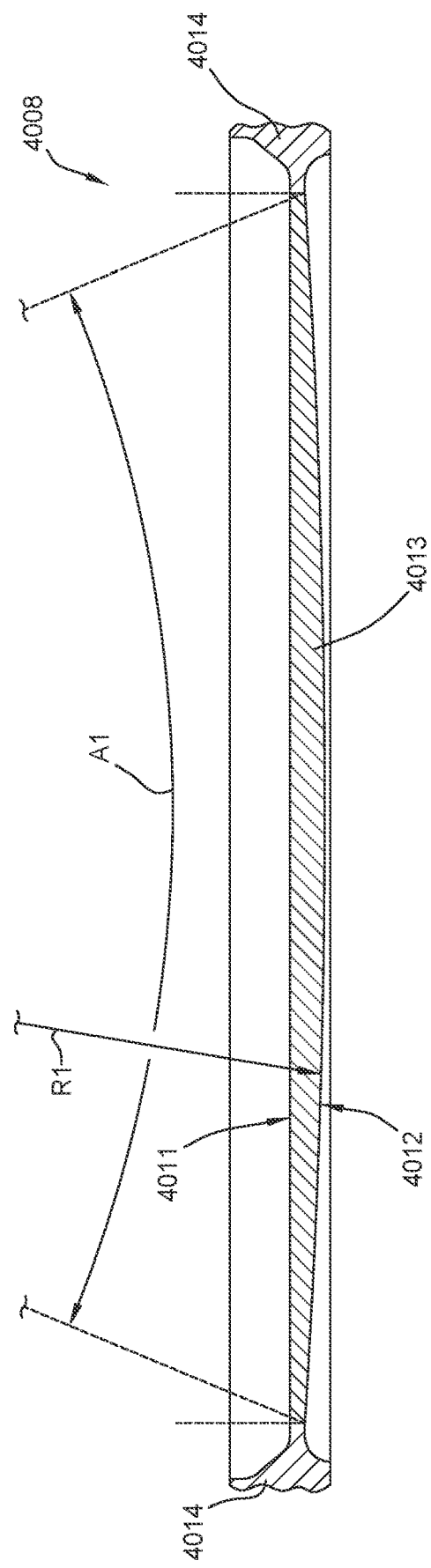
FIG. 41 is a schematic enlarged view of the window shown in FIG. 40, according to one implementation.

FIG. 41 is a schematic enlarged view of the window 4008 shown in FIG. 40, according to one implementation. The second face 4012 of the window 4008 includes one or more portions, and each of the one or more portions has a radius of curvature R1 that is larger than a width W1 of the inner section 4013 by at least a factor of 1.5. In one or more embodiments, the radius of curvature R1 is larger than the width W1 by at least a factor of 2.0. The second face 4012 has an arc angle A1 that is less than 25 degrees. In one or more embodiments, the arc angle A1 is 20 degrees or less, such as 15 degrees or 20 degrees. In one or more embodiments, the arc angle A1 is 6.0 degrees or less. In one or more examples of such embodiments, the arc angle A1 is within a range of 3.7 degrees to 4.3 degrees, such as 4.0 degrees.

As discussed herein, the present disclosure facilitates reduced or removed effects that the shape of a window (e.g., concave, convex, or substantially flat) can have on processing (e.g., epitaxial deposition) operations, processing parameters, and film thickness growth. A substantially flat window (such as the window 4008 shown in FIGS. 40 and 41) can be used with a variety of processing chamber configurations, a variety of process kit configurations, and/or a variety of process configurations.

Figure 42:
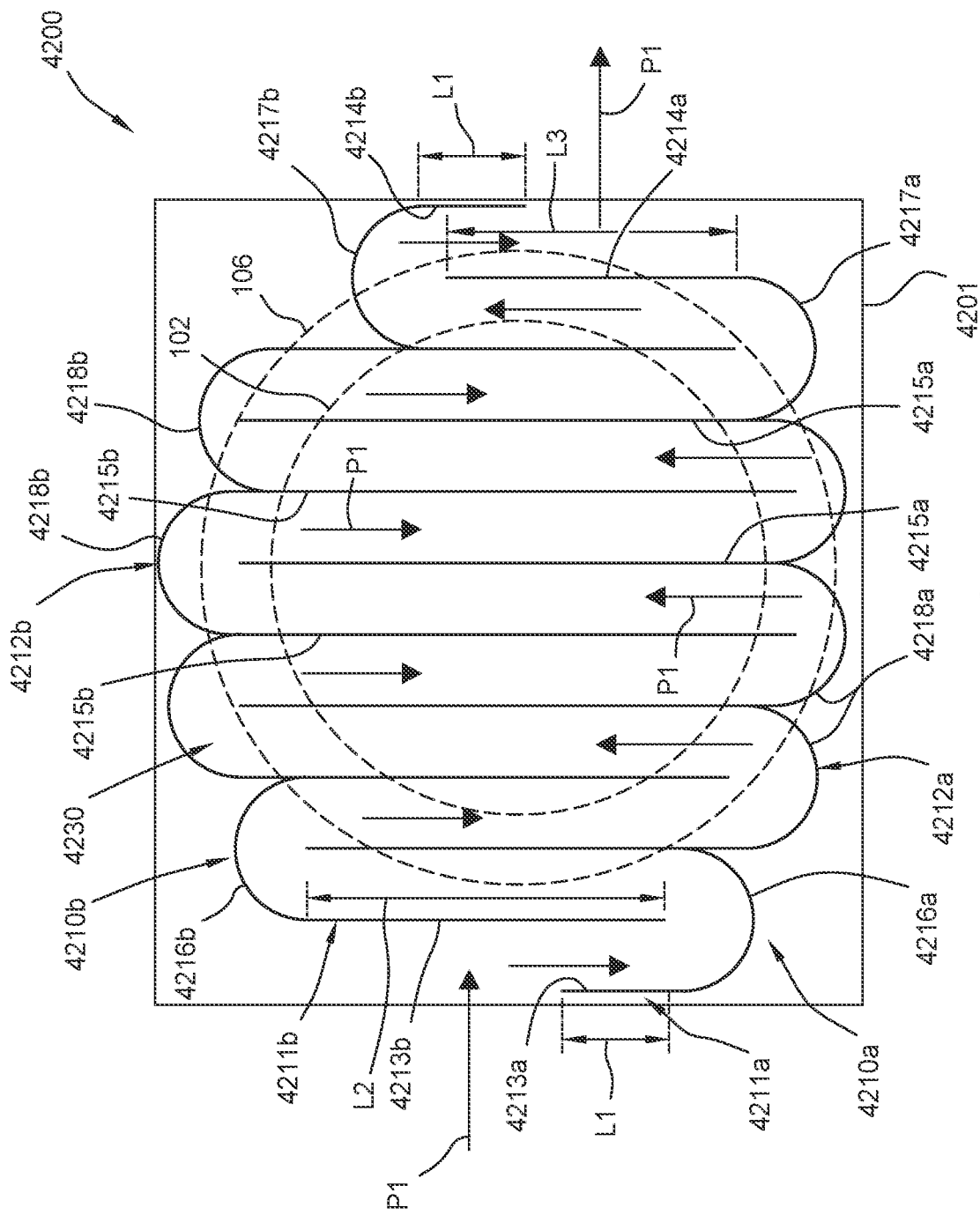
FIG. 42 is a schematic top view of a flow guide, according to one implementation.

FIG. 42 is a schematic top view of a flow guide 4200, according to one implementation. The flow guide 4200 is disposed above the substrate 102. The flow guide 4200 includes a plate 4201 having a first face and a second face opposing the first face. The flow guide 4200 includes a first fin set 4210a extending from the second face of the plate 4201, and a second fin set 4210b extending from the second face of the plate 4201. The second fin set 4210b is spaced from the first fin set 4210a to define a flow path 4230 between the first fin set 4210a and the second fin set 4210b. The flow path 4230 has a serpentine pattern between the first fin set 4210a and the second fin set 4210b. The flow path 4230 is a single flow path between the first fin set 4210a and the second fin set 4210b. The serpentine flow path 4230 includes a plurality of linear paths (such as straightaways) and a plurality of arcuate paths (such as arcuate turns) interleaved with the plurality of linear paths. In one or more embodiments, the serpentine flow path 4230 includes a plurality of linear (such as rectangular) sections bounded at least partially by the linear sections of the two fin sets 4210a, 4210b. In one or more embodiments, the serpentine flow path 4230 includes a plurality of arcuate (such as semi-circular) sections bounded at least partially by the arcuate sections of the two fin sets 4210a, 4210b. For each fin set 4210a, 4210b, the respective fins can be coupled together. For example, the respective fins can be integrally formed, fastened together, fused together, welded together, and/or otherwise attached to each other to make up the respective fin set 4210a, 4210b.

Each of the first fin set 4210a and the second fin set 4210b includes a plurality of linear sections 4211a, 4211b intersecting a plurality of arcuate sections 4212a, 4212b. The first fin set 4210a are interleaved with the second fin set 4210b such that the plurality of linear sections 4211a of the first fin set 4210a are disposed in an alternating arrangement with the plurality of linear sections 4211b of the second fin set 4210b. For each of the first fin set 4210a and the second fin set 4210b the plurality of linear sections 4211a, 4211b includes a first outer linear section 4213a, 4213b, a second outer linear section 4214a, 4214b, and a plurality of middle linear sections 4215a, 4215b disposed between the first outer linear section 4213a, 4213b and the second outer linear section 4214a, 4214b.

For each of the first fin set 4210a and the second fin set 4210b the plurality of arcuate sections 4212a, 4212b includes a first outer arcuate section 4216a, 4216b, a second outer arcuate section 4217a, 4217b, and a plurality of middle arcuate sections 4218a, 4218b disposed between the first outer arcuate section 4216a, 4216b and the second outer arcuate section 4217a, 4217b. For each of the first fin set 4210a and the second fin set 4210b the first outer linear section 4213a, 4213b intersects an end of the first outer arcuate section 4216a, 4216b, and the second outer linear section 4214a, 4214b intersects an end of the second outer arcuate section 4217a, 4217b. For each of the first fin set 4210a and the second fin set 4210b each of the plurality of middle linear sections 4215a, 4215b intersects two respective ends of two of the plurality of arcuate sections 4212a, 4212b.

The first outer linear section 4213a of the first fin set 4210a and the second outer linear section 4214b of the second fin set 4210b have a first length L1. Each of the first outer linear section 4213b of the second fin set 4210b and the second outer linear section 4214a of the first fin set 4210a has a length L2, L3 that is longer than the first length L1.

During the deposition operation and/or the cleaning operation, gases (such as the one or more process gases P1) flow through the serpentine flow path 4230 between the first fin set 4210a and the second fin set 4210b. The fins and the serpentine flow path 4230 facilitate adjustability of process parameters and facilitates reduced or eliminated interference with performance (such as reduced or eliminated vortex effects when the substrate 102 is rotated during processing). The fins and the serpentine flow path 4230 also facilitate efficient use of gases (such as the one or more process gases P1). The one or more process gases P1 flow into the flow path 4230 between the first outer linear section 4213a and the first outer linear section 4213b. The one or more process gases P1 flow out of the flow path 4230 between the second outer linear section 4214a and the second outer linear section 4214b.

The flow path 4230 facilitates a longer flow path and a relatively smaller flow path cross-sectional area, which can increase gas flow speeds for modularity, parameter adjustability, and enhanced uniformity at substantially similar gas partial pressures. The fins of the flow guide 4200 facilitate reduced or eliminated shadowing effects. The flow guides described herein are modular and swappable.

Figure 43:
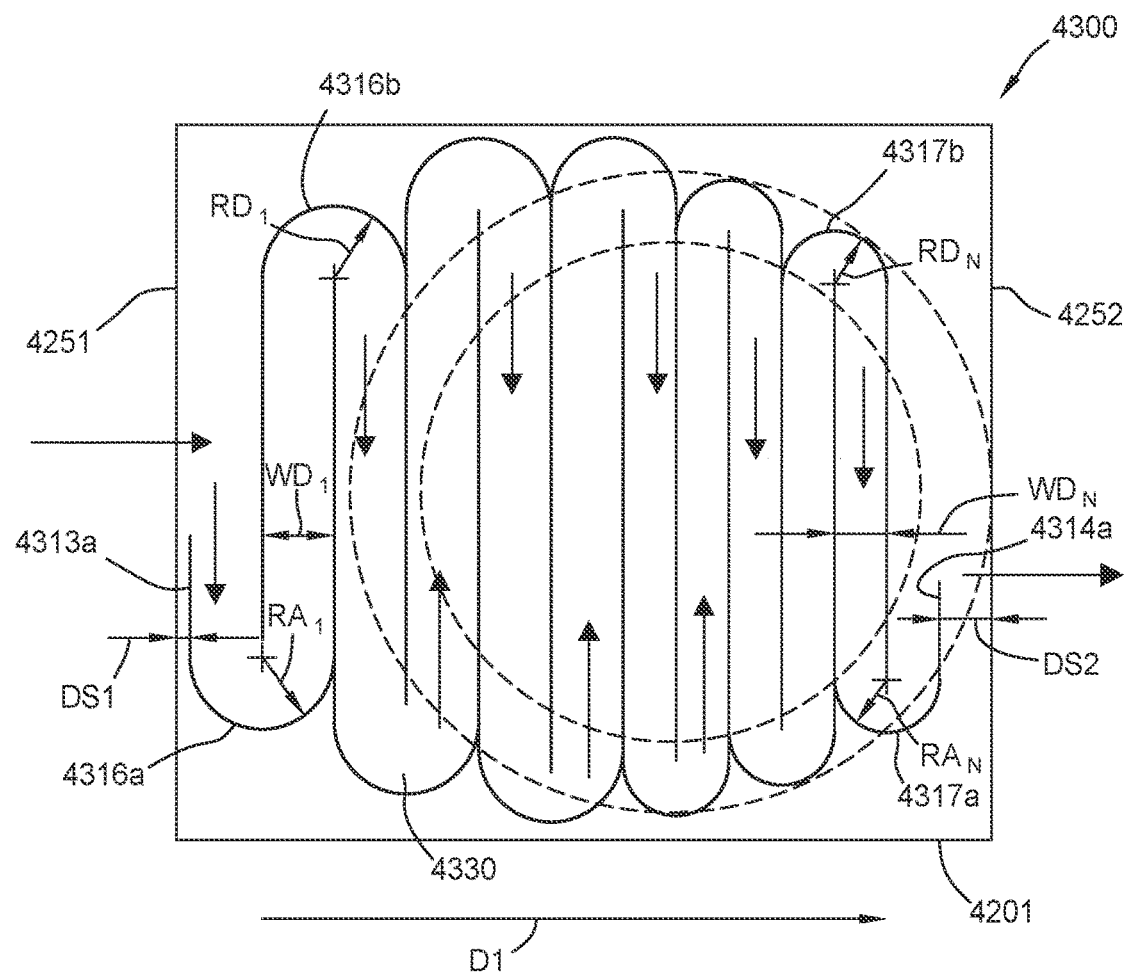
FIG. 43 is a schematic top view of a flow guide, according to one implementation.

FIG. 43 is a schematic top view of a flow guide 4300, according to one implementation. The flow guide 4300 is similar to the flow guide 4200 shown in FIG. 42, and includes one or more of the aspects, features, components, properties, and/or operations thereof. For each of a first fin set 4310a and a second fin set 4310b a plurality of arcuate sections 4312a, 4312b have a radius gradient that decreases in a direction D1 extending from a first side of the plate 4201 and to a second side of the plate 4201. For example, an Nth radius $RA_N$ of a second outer arcuate section 4317a of the first fin set 4310a is smaller than a first radius $RA_1$ of a first outer arcuate section 4316a of the first fin set 4310a, and an Nth radius $RD_N$ of a second outer arcuate section 4317b of the second fin set 4310b is smaller than a first radius $RD_1$ of a first outer arcuate section 4316b. A flow path 4330 has a width gradient that decreases in the direction D1. For example, an Nth width $WD_N$ is smaller than a first width $WD_1$ of the flow path 4330. The reducing gradients facilitate increase gas speeds and uniformity of adjustability of process parameters. The width gradient facilitates uniformities of gas flow speed adjustments.

The plate 4201 includes a first end 4251 and a second end 4252 opposite of the first end 4251. The first outer linear section 4313a of the first fin set 4310a is disposed at a first distance DS1 relative to the first end 4251 of the plate 4201. The second outer linear section 4314a of the first fin set 4310a is disposed at a second distance DS2 relative to the second end 4252 of the plate 4201. The second distance DS2 is different than the first distance DS1. In the implementation shown in FIG. 43, the second distance DS2 is larger than the first distance DS1.

Figure 44:
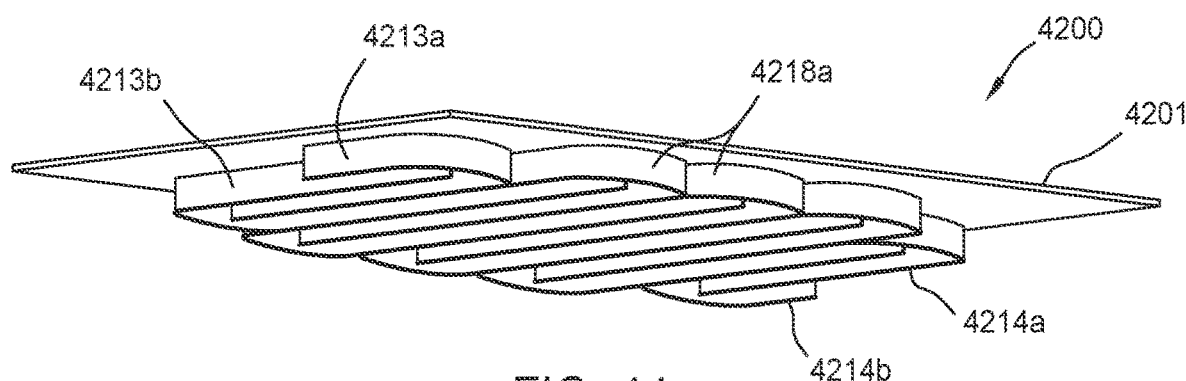
FIG. 44 is a schematic bottom perspective view of the flow guide shown in FIG. 42, according to one implementation.

FIG. 44 is a schematic bottom perspective view of the flow guide 4200 shown in FIG. 42, according to one implementation.

Figure 45:
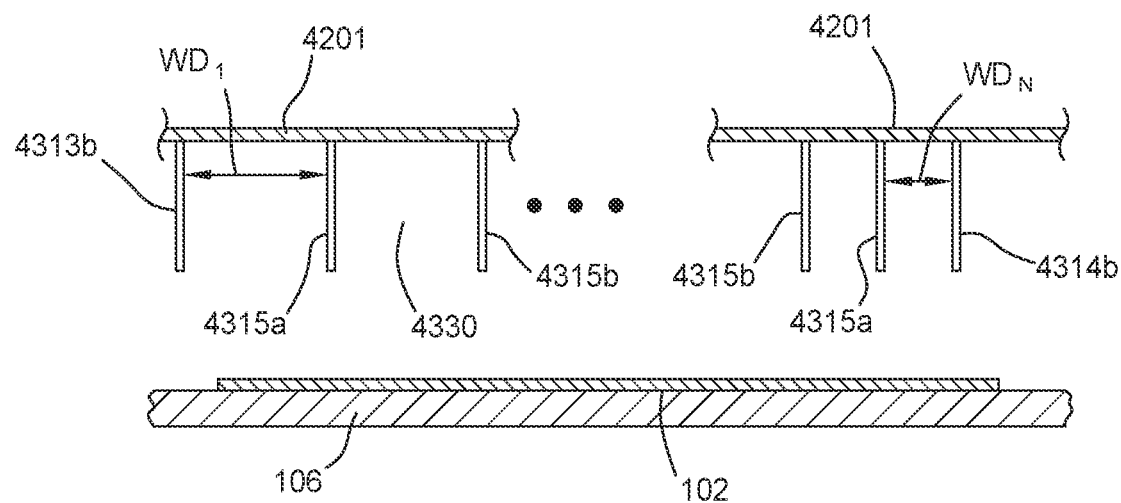
FIG. 45 is a schematic partial side view of the flow guide shown in FIG. 43, according to one implementation.

FIG. 45 is a schematic partial side view of the flow guide 4300 shown in FIG. 43, according to one implementation. The first fin set 4310a includes a first outer linear section 4313a, a second outer linear section 4314a, and a plurality of middle linear sections 4315a. The second fin set 4310b includes a first outer linear section 4313b, a second outer linear section 4314b, and a plurality of middle linear sections 4315b. In the implementation shown in FIG. 45, the sections of the flow path 4330 between the respective fins are rectangular in shape.

Figure 46:
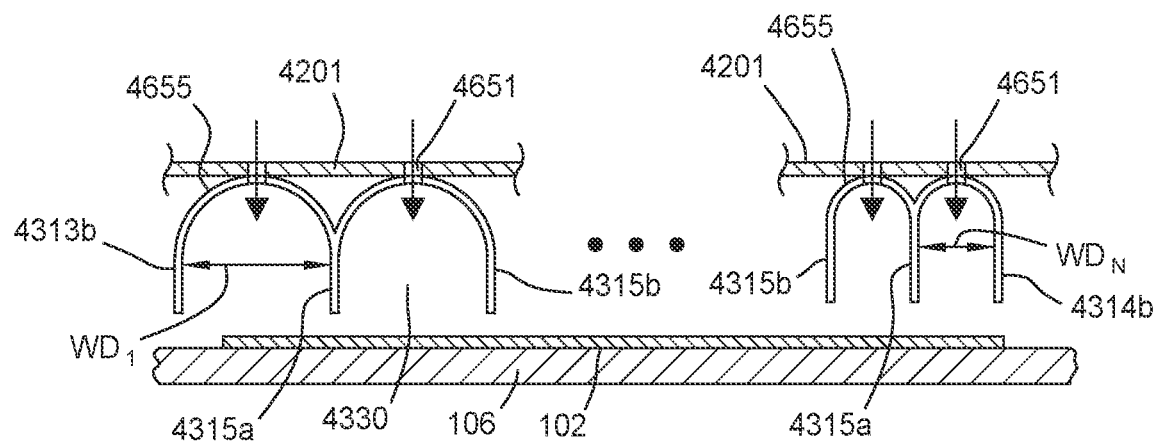
FIG. 46 is a schematic partial side view of the flow guide shown in FIG. 43, according to one implementation.

FIG. 46 is a schematic partial side view of the flow guide 4300 shown in FIG. 43, according to one implementation. In the implementation shown in FIG. 46, the sections of the flow path 4330 between the respective fins include portions that are semi-circular in shape and portions that are rectangular in shape.

In the implementation shown in FIG. 46, the flow guide 4300 includes a plurality of flow openings 4651 extending through the plate 4201 and to the flow path 4330. The flow openings 4651 facilitate injecting gases into the lower portion 136a of the processing volume 136 from the upper portion 136b of the processing volume 136. In the implementation shown in FIG. 46, a plurality of second arcuate sections 4655 are disposed between the respective fins. The second arcuate sections 4655 interface with the plate 4201. The flow openings 4651 extend through the plate 4201 and the second arcuate sections 4655.

Figure 47:
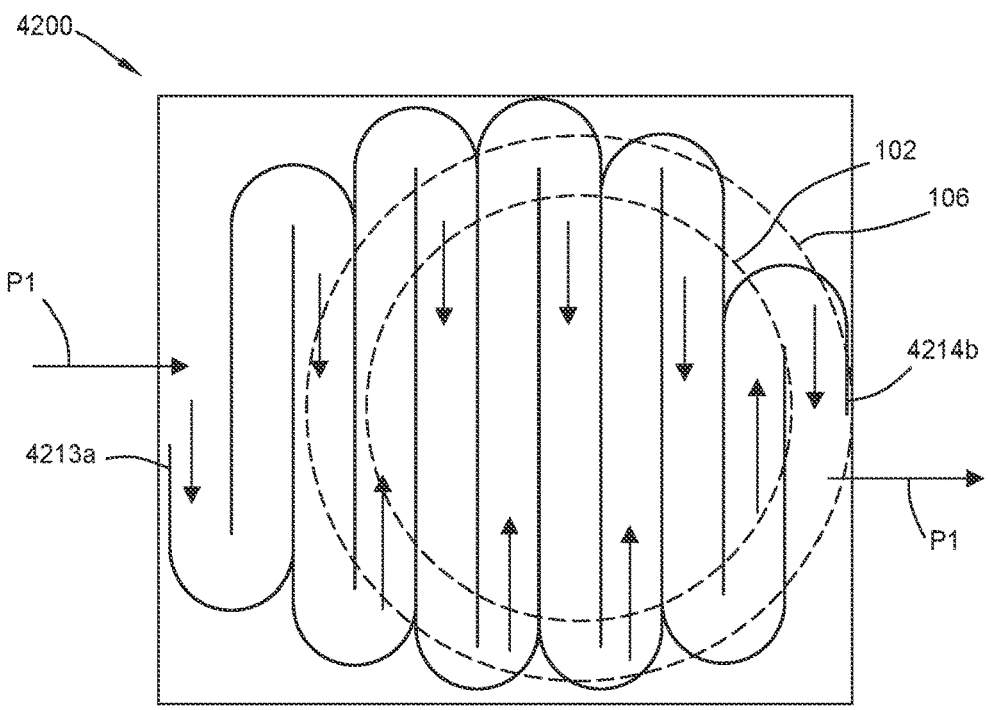
FIG. 47 is a schematic top view of the flow guide shown in FIG. 42, according to one implementation.

FIG. 47 is a schematic top view of the flow guide 4200 shown in FIG. 42, according to one implementation. In the implementation shown in FIG. 47, the flow guide 4200 is shifted laterally (relative to the position shown in FIG. 42) to be more laterally offset relative to the substrate 102 and the substrate support 106. For example, the second outer linear section 4214b is moved to be aligned at least partially above the substrate support 106, and the first outer linear section 4213a is moved to be at a farther distance relative to the substrate 102 and the substrate support 106. The movement of the flow guide 4200 can facilitate adjustability of process parameters and deposition thickness. The offset position of the flow guide 4200 facilitates operational uniformity (e.g., deposition uniformity) such as when the substrate 102 is rotated during processing.

Figure 48:
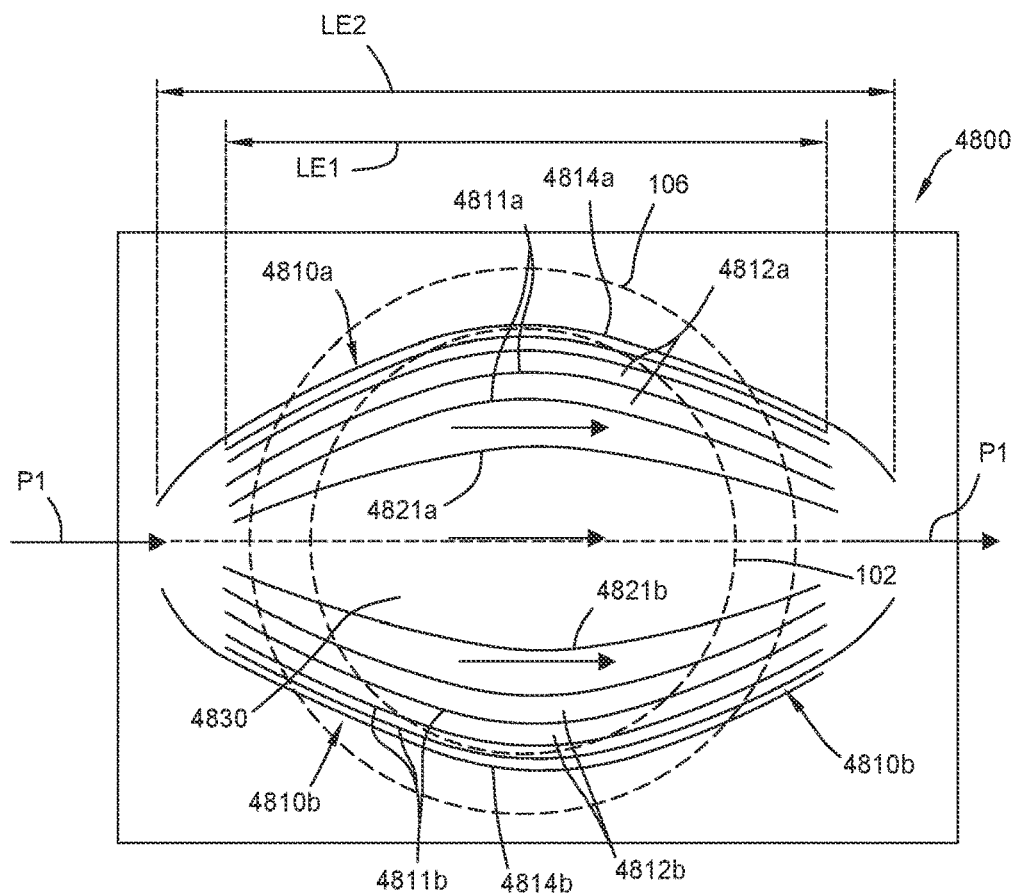
FIG. 48 is a schematic top view of a flow guide, according to one implementation.

FIG. 48 is a schematic top view of a flow guide 4800, according to one implementation. The flow guide 4800 is similar to the flow guide 4200 shown in FIG. 42, and includes one or more of the aspects, features, components, properties, and/or operations thereof.

The flow guide 4800 includes a first fin set 4810a extending that includes a plurality of first fins 4811a spaced from each other to define a first set of flow paths 4812a. The flow guide 4800 includes a second fin set 4810b having a plurality of second fins 4811b spaced from each other to define a second set of flow paths 4812b. The flow guide 4800 includes a central flow path 4830 between a first inner fin 4821a of the first fin set 4810a and a second inner fin 4821b of the second fin set 4810b.

Each of the plurality of first fins 4811a, the plurality of second fins 4811b, the first set of flow paths 4812a, and the second set of flow paths 4812b is arcuate. The central flow path 4830 is convex in shape. The first fin set 4810a includes a first outer fin 4814a disposed outwardly of the plurality of first fins 4811a, and the second fin set 4810b includes a second outer fin 4814b disposed outwardly of the plurality of second fins 4811b. Each of the first outer fin 4814a and the second outer fin 4814b has a length LE2 that is longer than lengths LE1 of the plurality of first fins 4811a and the plurality of second fins 4811b.

The flow guide 4800 facilitates equal flow flux across a plurality of regions of an exposed surface of the substrate 102. As an example, gas speeds of one or more process gases P1 across a first region (aligned under the first set of flow paths 4812a), a second region (aligned under the central flow path 4830), and a third region (aligned under the second set of flow paths 4812b) of the substrate 102 are substantially equal to each other. The one or more process gases P1 can be supplied to each of the central flow path 4830, the first set of flow paths 4812a, and the second set of flow paths 4812b from the same gas source. The present disclosure contemplates that the one or more process gases P1 can be supplied independently to each of the central flow path 4830, the first set of flow paths 4812a, and the second set of flow paths 4812b.

Figure 49:
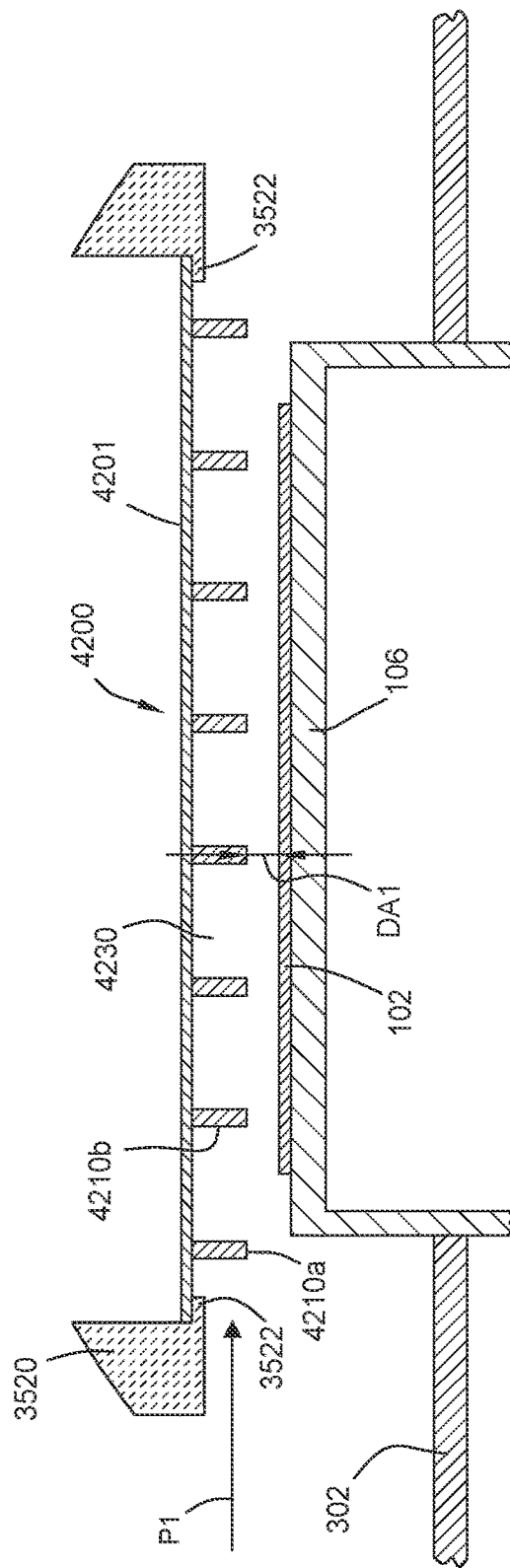
FIG. 49 is a schematic partial side view of the flow guide shown in FIG. 42 in a processing chamber during a lowered condition, according to one implementation.

FIG. 49 is a schematic partial side view of the flow guide 4200 shown in FIG. 42 in a processing chamber during a lowered condition, according to one implementation.

Figure 50:
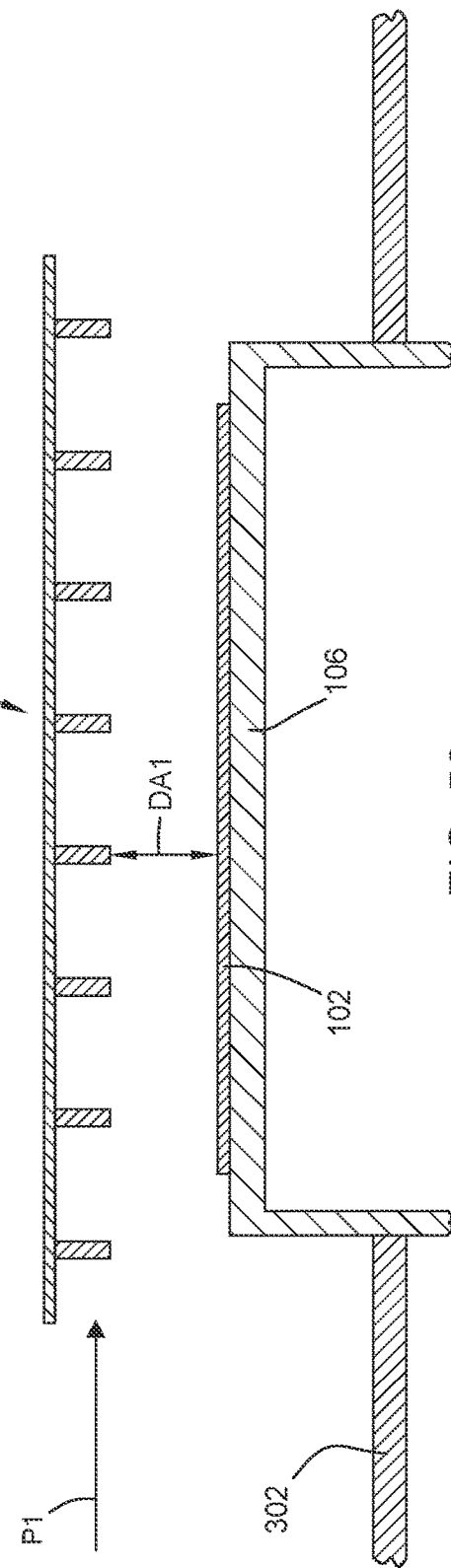
FIG. 50 is a schematic partial side view of the flow guide shown in FIG. 49 during a raised condition, according to one implementation.

FIG. 50 is a schematic partial side view of the flow guide 4200 shown in FIG. 49 during a raised condition, according to one implementation.

As shown in the lowered condition of FIG. 49, a distance DA1 between the first set of fins 4210a and the second set of fins 4210b (on one side) and the substrate 102 (on another side) is lesser than the distance DA1 shown in FIG. 50. One or more of the substrate support 106 and/or the plate 4201 of the flow guide 4200 can be moved to adjust the distance DA1. The distance DA1 can be adjusted during processing operations and/or between iterations of processing operations. In one or more embodiments, the plate 4201 can remain supported on the one or more ledges 3522 of the upper liner 3520 during adjustment of the distance DA1. In one or more embodiments, the plate 4201 can lift off to be at a gap from the one or more ledges 3522 during adjustment of the distance DA1. In one or more embodiments, the distance DA1 shown in FIG. 49 is within a range of 0.2 mm to 2.0 mm (such as 1.0 mm) to facilitate a sealing condition between the fins of the fin sets 4210a, 4210b and the substrate 102 and guiding of gases through the serpentine pattern of the flow path 4230. The distance DA1 during process (e.g., deposition) operations can vary within a range of 0.2 mm to 5.0 mm (such as within a range of 1.0 mm to 5.0 mm).

FIG. 51 is a schematic partial side view of the flow guide 4200 shown in FIG. 49 in a tilted position, according to one implementation. The flow guide 4200 is oriented in the tilted position such that the plate 4201 is oriented at an oblique angle relative to the substrate 102. In the tilted position, a first fin 5101 is disposed at a first vertical position that is different than a second vertical position of a second fin 5102. In the implementation shown in FIG. 51, a second ledge 5122 has a height that is taller than a height of a first ledge 3522. The second ledge 5122 can be angularly offset from one or more other ledges (such as the first ledge 3522) such that the plate 4201 of the flow guide 4200 can be raised, rotated, and lowered into the tilted position shown in FIG. 51. For example, the flow guide 4200 can be moved from a horizontal position (shown for example in FIG. 49) and to the tilted position. An upper surface of the first ledge 3522 and/or the second ledge 5122 can be tapered (as shown for the second ledge 5122) to interface with the tilted plate 4201 that contacts the ledges 3522, 5122. In one or more embodiments, the flow guide 4200 can be moved to the tilted position by raising the substrate support 106 to engage a first portion of the flow guide 4200 before engaging a second portion such that the flow guide 4200 is tilted by further raising of the substrate support 106.

Figure 53:
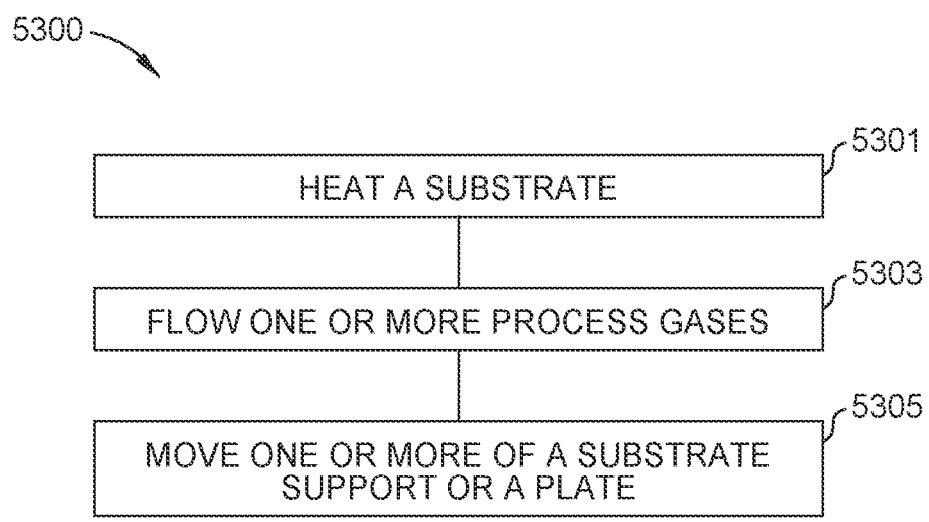
FIG. 53 is a schematic block diagram view of a method of processing substrates, according to one implementation.

FIG. 52 is a schematic partial side view of the flow guide 4200 shown in FIG. 49 in the tilted position, according to one implementation. In one or more embodiments, the plate 4201 of the flow guide 4200 is coupled to the first flange 331 and the second flange 332. Each of the first flange 331 and the second flange 332 includes a tapered lower surface 5210 such that the raising of the substrate support 106 contacts a taller portion (having a first height) of each flange 331, 332 prior to a shorter portion (having a second height) of each flange 331, 332 such that further raising of the substrate support 106 tilts the flow guide 4200. FIG. 53 is a schematic block diagram view of a method 5300 of processing substrates, according to one implementation.

Operation 5301 of the method 5300 includes heating a substrate positioned on a substrate support.

Operation 5303 includes flowing one or more process gases over the substrate to form one or more layers on the substrate. The flowing of the one or more process gases over the substrate includes guiding the one or more process gases through one or more flow paths defined at least partially by a plurality of fins extending from a plate of a flow guide.

Operation 5305 includes moving one or more of the substrate support or the plate to adjust a distance between the plurality of fins and the substrate. In one or more embodiments, the moving of the plate includes raising the plate to lift the plate relative to a liner, and lowering the plate to engage the liner and support the plate on the liner in the tilted position. In one or more embodiments, the moving of the plate includes raising the substrate support to engage one or more flanges of the flow guide and tilt the plate into the tilted position. The one or more flanges includes a first portion having a first height, and a second portion having a second height that is lesser than the first height.

Benefits of the present disclosure include sealing lower portions of process volumes from upper portions of process volumes during processing operations; modularity in process application; adjusting deposition process parameters at low rotation speeds, high pressure, and low flow rates; having the ability to clean processing chambers (such as liners and windows), for example upper portions of processing volumes; reduced or removing effects of window shapes (e.g., profiles) on processing operations; reduced or eliminated formation of materials on windows; use of curved (e.g., convex and/or concave) windows; temperature adjusting and temperature uniformity; deposition uniformity; high throughput and production yield; adjustability of gas flow paths; mitigated rotation effects; separate provisions of gases to upper portions of processing volumes; and reduced or eliminated interference with heating (such as light from heat lamps).

As an example, the rectangular flow opening for the one or more process gases facilitate a smaller cross-section, which facilitates adjusting process parameters (such as gas pressure, processing temperature, gas compositions, and/or gas flow rate) for the one or more process gases. The flow guide also facilitates the ability to have a cleaning gas path (which at least partially bypasses the rectangular flow opening) that facilitates cleaning of components (such as one or more surfaces of the window and/or one or more surfaces of the upper liner) in the internal volume. The sealing and adjusting facilitates low rotation speeds (such as less than 8 RPM) of the substrate support, high pressures of the one or more process gases, and low flow rates of the one or more process gases. As another example, the sealing and the rectangular flow opening facilitates mitigating the effects (such as gas vortex) of rotation of the substrate support on the one or more process gases. As a further example, the flow guide facilitates adjusting while reducing or eliminating interference of the adjustment with the heating of components (such as the substrate and/or the pre-heat ring). The rectangular flow opening, the sealing, and the adjustability also facilitate reducing or removing the effects that the shape of a window (e.g., concave, convex, or substantially flat) can have on processing (e.g., epitaxial deposition) operations, processing parameters, and film thickness growth. The reducing or removing of effects at least partially isolates the window shape from processing efficacy. Additionally, as an example, the adjustability facilitates the use of concave or convex windows, in addition to windows that are substantially flat. The present disclosure contemplates that substantially flat windows may be used with implementations described herein.

Furthermore, the implementations of the present disclosure (such as the implementations of the middle plate) are modular and can be used across a variety of processing (e.g., deposition) operations and/or cleaning operations, including across a variety of operation parameters. Moreover, one or more aspects, features, components, operations and/or properties of the various process kits (such as the middle plates) described herein can be selected, combined, and/or modified depending on the processing parameters (such as flow rate, temperature, pressure, gas composition, etc.) used in the processing operations and/or cleaning operations.

The sealing also facilitates reduced or eliminated formation of materials (such as deposition of deposition materials during processing operations) on windows (such as the upper window).

It is contemplated that one or more aspects disclosed herein may be combined. As an example, one or more aspects, features, components, operations and/or properties of the processing chamber 100, the controller 120, the processing chamber 300, the processing chamber 700, the lock stop structures 910a, 910b, the lock extensions 1001, the processing chamber 1300, the processing chamber 2300, the process kit 310, the process kit 1310, the process kit 2310, the fins 2610, 2710, 2810, 3110 and/or 3210, the support legs 3310, 3311, the method 3400, the processing chamber 3500, the process kit 3510, the method 3900, the processing chamber 4000, the window 4008, the flow guide 4200, the flow guide 4300, the flow openings 4651, the flow guide 4800, and/or the method 5300 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A process kit for disposition in a processing chamber applicable for use in substrate manufacturing, the process kit comprising:
    a flow guide comprising:
        a middle plate having a first side and a second side opposing the first side along a first direction, the first side and the second side being arcuate,
        a first flange extending outwardly relative to a third side of the middle plate and outwardly relative to an outer face of the middle plate,
        a second flange extending outwardly relative to a fourth side of the middle plate and outwardly relative to the outer face of the middle plate, the fourth side opposing the third side along a second direction that intersects the first direction, and
        a rectangular flow opening defined between a first planar inner face of the first flange and a second planar inner face of the second flange,
        one or more first openings formed in the middle plate adjacent to the first side, and
        one or more second openings formed in the middle plate adjacent to the second side.

2. The process kit of claim 1, wherein each of the first flange and the second flange is semi-circular in shape.

3. The process kit of claim 1, wherein an inner face of the middle plate comprises one or more fins each having a planar edge, an arcuate edge, or a patterned edge, wherein each of the one or more fins has a length that is less than a diameter extending between the first side and the second side.

4. The process kit of claim 1, wherein the flow guide further comprises:
    a first edge section extending between the third side of the middle plate and the first flange; and
    a second edge section extending between the fourth side of the middle plate and the second flange.

5. The process kit of claim 4, wherein each of the first edge section and the second edge section is rectangular in shape.

6. The process kit of claim 5, wherein the flow guide further comprises:
    at least one of the one or more first openings formed between the first flange and the first edge section, and
    at least one of the one or more second openings formed between the second flange and the second edge section.

7. The process kit of claim 6, further comprising a cover, the cover comprising:
    a ring;
    a first protrusion extending from the ring and configured to extend into the first opening; and
    a second protrusion extending from the ring and configured to extend into the second opening.

8. The process kit of claim 7, wherein the first protrusion and the second protrusion are slidable respectively in the one or more first openings and the one or more second openings, wherein each of the one or more first openings, the one or more second openings, the first protrusion, and the second protrusion are semi-circular in shape.

9. The process kit of claim 1, further comprising a cover configured to cover the one or more first openings and the one or more second openings, the cover comprising a ring having a width that is larger than a major diameter of each of the one or more first openings and the one or more second openings.

10. The process kit of claim 9, wherein the cover is movable to slide one or more protrusions of the cover relative to the middle plate.

11. A processing chamber applicable for use in substrate manufacturing, comprising:
    a window at least partially defining an internal volume;
    a plurality of lamps;
    a substrate support disposed in the internal volume, the substrate support comprising a support face; and
    a process kit disposed in the internal volume, the process kit comprising a flow guide, the flow guide comprising:
        a middle plate disposed between the support face and the plurality of lamps, the middle plate having a first side and a second side, the first side and the second side being arcuate,
        a first flange extending outwardly relative to a third side of the middle plate and outwardly relative to an outer face of the middle plate,
        a second flange extending outwardly relative to a fourth side of the middle plate and outwardly relative to the outer face of the middle plate,
        a rectangular flow opening defined between a first planar inner face of the first flange and a second planar inner face of the second flange, and
        one or more first openings formed in the middle plate adjacent to the first side, and
        one or more second openings formed in the middle plate adjacent to the second side.

12. The processing chamber of claim 11, wherein the first flange and the second flange are supported on a pre-heat ring disposed outwardly of the substrate support.

13. The processing chamber of claim 11, wherein the middle plate is supported on a liner.

14. A process kit for disposition in a processing chamber applicable for use in substrate manufacturing, the process kit comprising:
    a flow guide comprising:
        a middle plate having a first side and a second side opposing the first side along a first direction, the first side and the second side being arcuate,
        a first flange extending outwardly relative to a third side of the middle plate and outwardly relative to an outer face of the middle plate,
        a second flange extending outwardly relative to a fourth side of the middle plate and outwardly relative to the outer face of the middle plate, the fourth side opposing the third side along a second direction that intersects the first direction,
        a rectangular flow opening defined between a first planar inner face of the first flange and a second planar inner face of the second flange
        a first edge section extending between the third side of the middle plate and the first flange, a second edge section extending between the fourth side of the middle plate and the second flange, a first opening formed between the first flange and the first edge section, and a second opening formed between the second flange and the second edge section.

15. The process kit of claim 14, wherein each of the first edge section and the second edge section is rectangular in shape.

16. The process kit of claim 14, further comprising a cover, the cover comprising:

a ring;

a first protrusion extending from the ring and configured to extend into the first opening; and a second protrusion extending from the ring and configured to extend into the second opening.

17. The process kit of claim 16, wherein the first protrusion and the second protrusion are slidable respectively in the first opening and the second opening, wherein each of the first opening, the second opening, the first protrusion, and the second protrusion is semi-circular in shape.

18. The process kit of claim 14, wherein an inner face of the middle plate comprises one or more fins each having a planar edge, an arcuate edge, or a patterned edge, wherein each of the one or more fins has a length that is less than a diameter extending between the first side and the second side.

19. The process kit of claim 18, wherein the middle plate is rectangular in shape, and the diameter is a second length extending between the first side and the second side.

20. The process kit of claim 14, wherein each of the first flange and the second flange is semi-circular in shape.

* * * * *